(12) United States Patent
Granger-Jones et al.

(10) Patent No.: US 9,503,044 B2
(45) Date of Patent: Nov. 22, 2016

(54) RECONFIGURABLE DIRECTIONAL COUPLER WITH A VARIABLE COUPLING FACTOR

(71) Applicant: RF Micro Devices, Inc., Greensboro, NC (US)

(72) Inventors: Marcus Granger-Jones, Scotts Valley, CA (US); Baker Scott, San Jose, CA (US); Ali Tombak, Santa Clara, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/815,252

(22) Filed: Jul. 31, 2015

(65) Prior Publication Data

US 2016/0268994 A1  Sep. 15, 2016

Related U.S. Application Data

(60) Provisional application No. 62/132,722, filed on Mar. 13, 2015.

(51) Int. Cl.
| H01P 5/18 | (2006.01) |
| H03H 7/46 | (2006.01) |
| H01F 38/14 | (2006.01) |
| H01P 1/10 | (2006.01) |

(52) U.S. Cl.
CPC .............. *H03H 7/468* (2013.01); *H01F 38/14* (2013.01); *H01F 2038/146* (2013.01)

(58) Field of Classification Search
CPC .............. H01P 5/18; H01P 5/184; H01P 1/10
USPC ......................... 333/109–112, 116
See application file for complete search history.

(56) References Cited

U.S. PATENT DOCUMENTS

| 3,611,199 | A | 10/1971 | Safran | |
| 5,363,071 | A * | 11/1994 | Schwent | H01P 5/04 333/111 |
| 6,329,880 | B2 | 12/2001 | Akiya | |
| 7,907,032 | B2 * | 3/2011 | Yamamoto | H01P 5/18 333/116 |
| 8,289,102 | B2 * | 10/2012 | Yamamoto | H01P 5/184 333/116 |
| 2002/0113601 | A1 | 8/2002 | Swank, II | |
| 2014/0266499 | A1 | 9/2014 | Noe | |
| 2015/0091668 | A1 | 4/2015 | Solomko et al. | |
| 2016/0065167 | A1 * | 3/2016 | Granger-Jones | H01F 38/14 333/112 |

(Continued)

OTHER PUBLICATIONS

Abdalla, M.A.Y. et al., "A Compact Highly Reconfigurable CMOS MMIC Directional Coupler," IEEE Transactions on Microwave Theory and Techniques, vol. 56, No. 2, IEEE, Feb. 2008, pp. 305-319.

(Continued)

*Primary Examiner* — Dean Takaoka
(74) *Attorney, Agent, or Firm* — Withrow & Terranova, P.L.L.C.

(57) ABSTRACT

The present disclosure relates to a reconfigurable directional coupler with a variable coupling factor that can be changed in value as a function of a desired transmit band of operation. The reconfigurable directional coupler includes a primary inductive segment, secondary inductive segments, and switch circuitry configured to change the total coupling capacitance formed between the primary and secondary inductive segments by selectively switching the secondary inductive segments into the secondary signal path. Simultaneously, the mutual inductance and coupling factor between the primary and the secondary inductive segments are reconfigured.

29 Claims, 16 Drawing Sheets

(56) References Cited

U.S. PATENT DOCUMENTS

| | | |
|---|---|---|
| 2016/0079649 A1 | 3/2016 | Ilkov et al. |
| 2016/0079650 A1 | 3/2016 | Solomko et al. |
| 2016/0172738 A1 | 6/2016 | Srirattana et al. |
| 2016/0172739 A1 | 6/2016 | Srirattana et al. |
| 2016/0172740 A1 | 6/2016 | Srirattana et al. |

OTHER PUBLICATIONS

Lee, Moon-Que, "Lumped directional coupler with a varactor tuned reflector for RFID applications," IEICE Electronics Express, vol. 6, No. 2, IEICE, Jan. 25, 2009, pp. 129-134.

Marcaccioli, Luca et al., "A Novel Reconfigurable Coupler for Intelligent SOP RF Front-ends," 2005 European Microwave Conference, vol. 1, IEEE, Oct. 4-6, 2005, 4 pages.

Murray-Lasso, M.A., "Unified Matrix Theory of Lumped and Distributed Directional Couplers," The Bell System Technical Journal, vol. 47, No. 1, Jan. 1968, pp. 39-71.

Sohn, Sung-Min et al., "Tunable and High Directivity Coupler for MRI Applications," 2014 IEEE MTT-S International Microwave Symposium, IEEE, Jun. 1-6, 2014, Tampa, FL, 3 pages.

Sun, Jiwei et al., "A Highly Reconfigurable Low-Power CMOS Directional Coupler," IEEE Transactions on Microwave Theory and Techniques, vol. 60, No. 9, IEEE, Sep. 2012, pp. 2815-2822.

Vizmuller, Peter, "2.9 Directional Couplers," RF Design Guide: Systems, Circuits, and Equations, Artech House, 1995, Boston, MA, pp. 98-108.

Vogel, Ryszard W., "Analysis and Design of Lumped- and Lumped-Distributed-Element Directional Couplers for MIC and MMIC Applications," IEEE Transactions on Microwave Theory and Techniques, vol. 40, No. 2, IEEE, Feb. 1992, pp. 253-262.

Zhou, Mi et al., "A Varactor Based 90° Directional Coupler With Tunable Coupling Ratios and Reconfigurable Responses," IEEE Transactions on Microwave Theory and Techniques, vol. 62, No. 3, IEEE, Mar. 2014, pp. 416-421.

Non-Final Office Action for U.S. Appl. No. 14/840,216, mailed Oct. 7, 2016, 7 pages.

\* cited by examiner

RECONFIGURABLE DIRECTIONAL COUPLER WITH A VARIABLE COUPLING FACTOR

RELATED APPLICATIONS

This application claims the benefit of U.S. provisional patent application No. 62/132,722, filed Mar. 13, 2015, the disclosure of which is incorporated herein by reference in its entirety.

FIELD OF THE DISCLOSURE

The present disclosure relates to a directional coupler, and more particularly to a reconfigurable directional coupler with a coupling factor that can be switched in value as a function of a desired transmit band of operation.

BACKGROUND

Cellular radios require accurate transmit power control to prevent unwanted interference between different wireless networks. This is commonly achieved by a power control loop in a transceiver. The power control loop senses a power signal coupled from a main radio frequency (RF) signal path which is connected to an antenna. This coupled power signal is then fed back to a power detection circuitry through a directional coupler placed between the power detection circuitry and a feed point of the antenna.

The antenna feed point needs to be able to adapt to multiple transmit bands resulting in a wide operating frequency range (e.g., from transmit band 12 at 699 MHz through transmit band 43 at 3.8 GHz in LTE telecommunication) of the transceiver. The transceiver may only be operating at one band at any particular time, but the directional coupler must be capable of operating at any band. It is desirable that the directional coupler is optimized for each operating transmit band.

The insertion loss (IL) of the directional coupler is related to the coupling factor (CF) as shown in equation (1). If the insertion loss needs to stay at a low value (IL<0.15 dB), it is desirable to keep the coupling factor relatively high (CF>20 dB). The insertion loss given by equation (1) can be >0.28 dB with a CF=12 dB.

$$IL_{coupler} \approx 10 \times \log[1 + 10^{-CF/10}] + \text{Implementation Losses} \quad (1)$$

In one example, the desired transmit power range of the antenna is from −50 dB to +24 dB and the power detection circuitry has a limited dynamic range, e.g. −78 dBm to +4 dBm. In order to accurately control the transmit power in the desired transmit power range and match the transmit power between the antenna and the power detection circuitry, the coupling factor of the directional coupler needs to be between 28 dB and 20 dB. The dynamic range of the power detection circuitry keeps the same values regardless of the operating frequency; while the coupling factor of the directional coupler may be frequency dependent for some implementations. Typically, the CF requirements at a low operating frequency (e.g. 699 MHz) determine the value of the coupler's coupling factor. At a higher operating frequency, the coupling factor can be compensated by switching in extra attenuation in a feedback path that extends from the directional coupler to the power detection circuitry.

In some applications, the feedback path may include additional switching, filtering and attenuation circuitries. The net coupling factor ($CF_{Net}$) is therefore the sum of the coupler's native coupling factor ($CF_{Native}$) and the insertion loss of the feedback path (typically ~2 dB), as in equation (2).

$$CF_{Net} = CF_{Native} + IL_{FeedbackPath} \quad (2)$$

The native coupling factor of the directional coupler and the circuitries in the feedback path need to be chosen carefully to keep the net coupling factor in a desirable range.

FIG. 1 illustrates a conventional directional coupler 10 that provides both forward and reverse power detection modes. The combination of the forward and reverse power detection modes provides the ability to estimate the antenna voltage standing wave ratio (VSWR). The coupler 10 includes a main signal path that extends between an RF input port $RF_{in}$ and an RF output port $RF_{out}$ and includes a primary inductive segment $L_1$; a secondary signal path that extends between a coupled port COUPLED and ground and includes a secondary inductive segment $L_2$. The primary inductive segment $L_1$ is mutually coupled with the secondary inductive segment $L_2$. A mutual coupling $K_{12}$ is very important due to its enablement to keep the inductive segments values low, resulting in a small low loss structure. A coupling capacitance $C_{12}$ is formed between the primary inductive segment $L_1$ and the secondary inductive segment $L_2$. Switch circuitry (SW1-SW4) is configured to select either forward or reverse power detection mode. When the coupler 10 receives a signal from the RF input port $RF_{in}$ (such as a transmit signal), a coupled signal is detected in the secondary signal path in the forward power detection mode. Herein, the switches SW1 and SW4 are open, the switches SW2 and SW3 are closed, and the secondary inductive segment $L_2$ is coupled between the coupled port COUPLED and a forward isolated port $ISO_{fwd}$. When the coupler 10 receives a signal from the RF output port $RF_{out}$ (such as a received signal from an antenna), a coupled signal is detected in the secondary signal path in the reverse power detection mode. Herein, the switches SW1 and SW4 are closed, the switches SW2 and SW3 are open, and the secondary inductive segment $L_2$ is coupled between the coupled port COUPLED and a reverse isolated port $ISO_{rev}$. A first tunable impedance termination $Z_{T1}$ is used in the forward power detection mode and a second tunable impedance termination $Z_{T2}$ is used in the reverse power detection mode. The native coupling factor of the coupler 10 has a frequency dependence, as shown in equations (3) and (4), which results in a large change in the coupling factor over the target operating frequency from 699 MHz to 3.8 GHz of around 14.7 dB, as shown in equation (5).

$$CF_{native} \approx -20 \times \log\left(\frac{Z_o}{Z_o + \frac{1}{j2\pi F_o C_{12}}}\right) \quad (3)$$

For CF>15 dB $CF_{Native} \approx K_o - 20 \times \log(F_0), K_o = -20 \log(Z_o \times 2\pi C_{12})$ (4)

$$\Delta CF = CF_{699M} - CF_{3.8G} \approx 20 \times \log\left(\frac{3.8\,G}{699M}\right) = 14.7\,dB \quad (5)$$

Herein, $Z_0$ represents system characteristic impedance, $F_0$ represents the operating frequency, and $C_{12}$ represents the coupling capacitance between the primary inductive segment $L_1$ and the secondary inductive segment $L_2$. As shown in equation (3), both the operating frequency $F_0$ and the coupling capacitance $C_{12}$ have an inverse relation with the native coupling factor $CF_{native}$. When the operating frequency $F_0$ or the coupling capacitance $C_{12}$ decrease, the $CF_{native}$ will increase; when the operating frequency $F_0$ or the coupling capacitance $C_{12}$ increase, the $CF_{native}$ will decrease.

The large $\Delta CF$ in equation (5) means that even if the $CF_{699\ MHz}$ is at the high end of the desirable range (~28 dB) at 699 MHz, the $CF_{3.8\ GHz}$ at 3.8 GHz will be quite low (~13.3 dB). Once the feedback path losses of ~2 dB are also taken into account (e.g., from attenuators, filter switches, and trace loss), the native coupling factor of the coupler at 3.8 GHz could be as low as ~11.3 dB, resulting in a lot of transmit power being routed to the feedback path and a large insertion loss (~0.34 dB) with implementation losses.

Furthermore, the size constraints in a modern smartphone require a compact coupler structure and preclude the use of wideband $\lambda/4$ transmission line approaches. The insertion loss and size constraints also make coupler structures with multiple stages unattractive.

Therefore, there is a need for a compact directional coupler with a reconfigurable structure, whose coupling factor can be reprogrammed as a function of a desired transmit band of operation and can achieve a desired value in a wide operating frequency range to keep insertion loss low. It is also desirable that the coupler structure is capable of supporting both forward and reverse power detection modes.

SUMMARY

The present disclosure relates to a reconfigurable directional coupler with a variable coupling factor that can be changed in value as a function of a desired transmit band of operation. The reconfigurable directional coupler includes a primary inductive segment, secondary inductive segments, switch circuitry, and tunable impedance terminations. The switch circuitry is configured to change the total coupling capacitance formed between the primary and secondary inductive segments by selectively switching the secondary inductive segments into the secondary signal path. Simultaneously, the mutual inductance and the coupling factor between the primary and the secondary inductive segments are reconfigured. The tunable impedance terminations are adjusted to optimize the coupler's directivity.

The presented reconfigurable directional coupler is suitable for integration as a compact structure on silicon on insulator (SOI) based devices.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
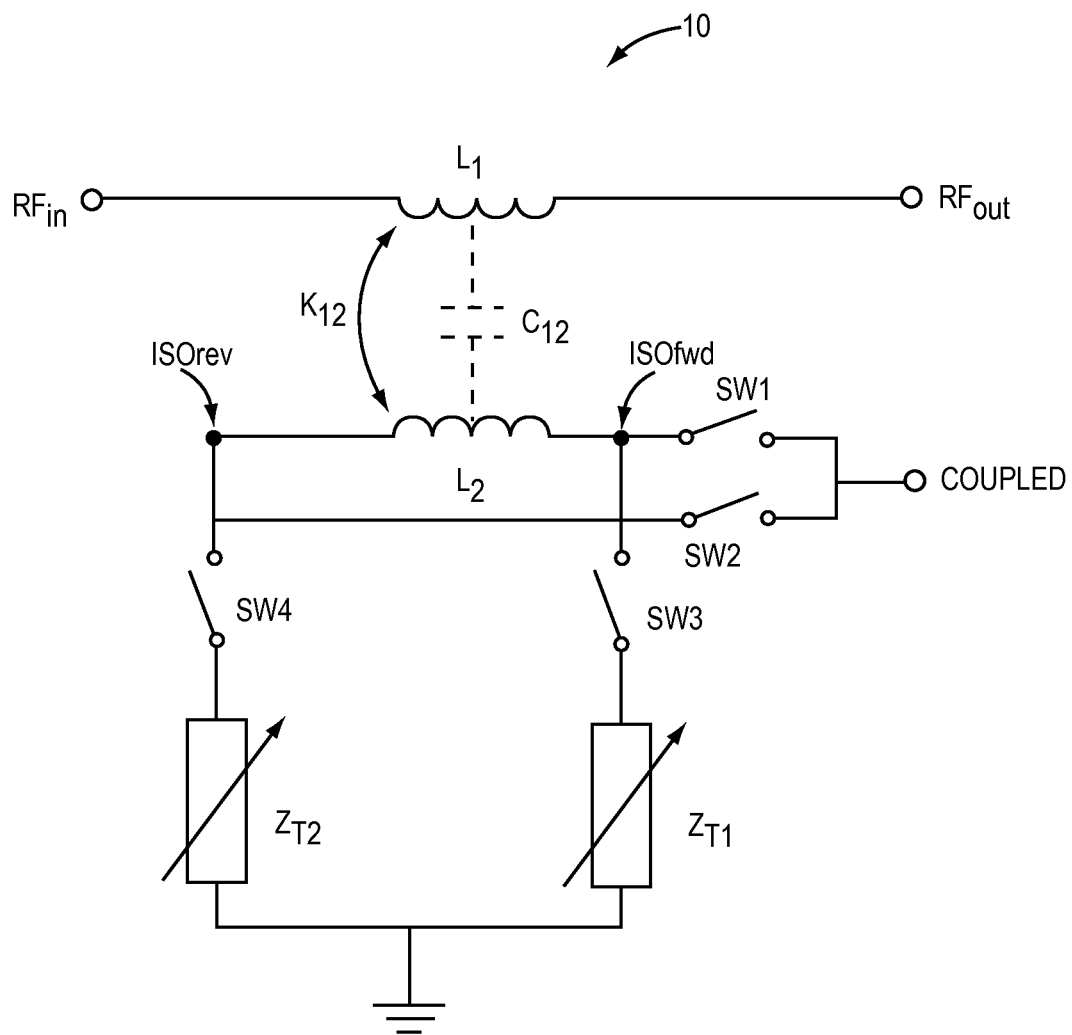
FIG. 1 shows a conventional directional coupler with forward and reverse power detection modes and tunable impedance terminations.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The present disclosure relates to a reconfigurable directional coupler with a variable coupling factor that can be changed in value as a function of a desired transmit band of operation. The present disclosure includes, but is not limited to, the following three different embodiments that implement a reconfigurable directional coupler with a variable coupling factor:

1. Switchable secondary inductive segments;
2. Switchable cascaded coupler; and
3. Switchable RF input ports to a primary inductive segment combined with switchable secondary inductive segments.

One embodiment of the present disclosure is to selectively switch the secondary inductive segments of a reconfigurable directional coupler into a secondary signal path based on a desired transmit band of operation. By selectively switching the secondary inductive segments into the secondary signal path, the total coupling capacitance and the mutual inductance formed between the primary and secondary inductive segments, as well as the active inductance of the secondary inductive segments can be changed simultaneously. As a consequence, the coupling factor of the reconfigurable directional coupler will vary.

A second embodiment of the present disclosure implements the reconfigurable directional coupler as a cascade of two separate coupler sections. A first coupler section comprises a first primary inductive segment mutually coupled with a first secondary inductive segment and a first coupling capacitance is formed between the first primary inductive segment and the first secondary inductive segment. A second coupler section comprises a second primary inductive segment mutually coupled with a second secondary inductive segment and a second coupling capacitance is formed between the second primary inductive segment and the second secondary inductive segment. There is no overlap between the first secondary inductive segment and the second primary inductive segment, and there is no overlap between the second secondary inductive segment and the first primary inductive segment. The secondary inductive segments of the two respective coupler sections can be selectively switched into the secondary signal path based on a desired transmit band of operation. By selectively switching the secondary inductive segments of the two respective coupler sections into the secondary signal path, the total coupling capacitance and the mutual inductance of the coupler will change and as a consequence, the coupling factor of the reconfigurable directional coupler will vary.

A third embodiment permits simultaneous change of the RF signal input port into the primary inductive segment of the reconfigurable directional coupler combined with selectively switching the secondary inductive segments into the secondary signal path. This embodiment is particularly appropriate for applications in which the reconfigurable directional coupler is integrated with an antenna switch module.

Switchable Secondary Inductive Segments

Figure 2A:
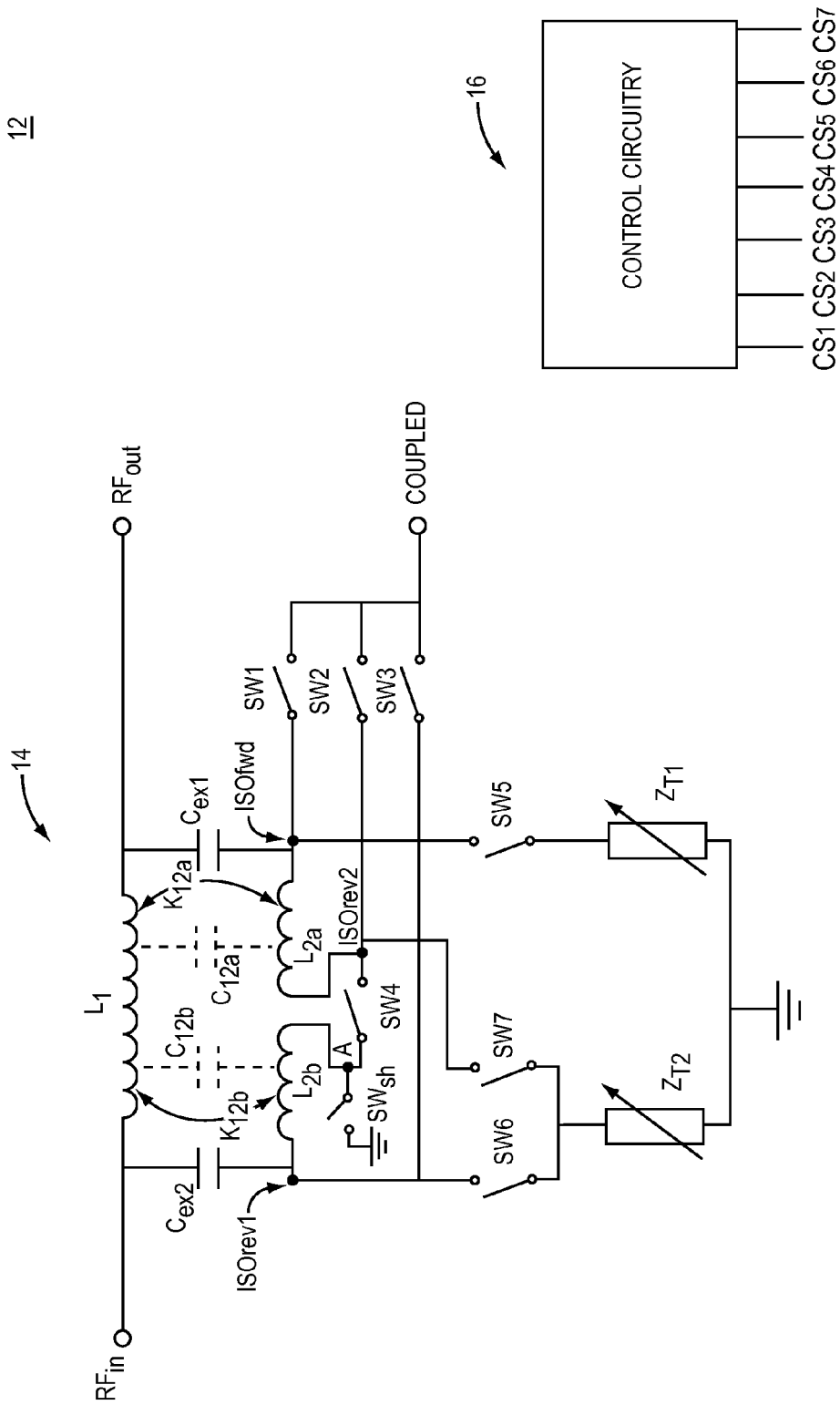
FIGS. 2A and 2B show an exemplary coupler system with switchable secondary inductive segments.

A first approach for a reconfigurable directional coupler is to selectively switch the secondary inductive segments into a secondary signal path. FIG. 2A shows a coupler system 12. The coupler system 12 includes a reconfigurable directional coupler 14 and control circuitry 16.

The reconfigurable directional coupler 14 comprises a main signal path that extends between an RF input port $RF_{in}$ and an RF output port $RF_{out}$ and includes a primary inductive segment $L_1$, as well as a secondary signal path that extends between a coupled port COUPLED and ground. The reconfigurable directional coupler 14 also includes a first secondary inductive segment $L_{2a}$, a second secondary inductive segment $L_{2b}$, switch circuitry (switches SW1-SW7), a first tunable impedance termination $Z_{T1}$ and a second tunable impedance termination $Z_{T2}$. The primary inductive segment $L_1$ is mutually coupled with the first and the second secondary segments, $L_{2a}$ and $L_{2b}$. A first mutual coupling $K_{12a}$ and a second mutual coupling $K_{12b}$ are expected to be in the 0.7-0.9 range, which keeps the inductive segments values low, resulting in a small low loss structure. A first coupling capacitance $C_{12a}$ is formed between the first secondary inductive segment $L_{2a}$ and a first portion of the primary inductive segment $L_1$, and a second coupling capacitance $C_{12b}$ is formed between the second secondary inductive segment $L_{2b}$ and a second portion of the primary inductive segment $L_1$. It is easy to notice that extrinsic capacitors, such as $C_{EX1}$ and $C_{EX2}$, could be explicitly added between the main signal path and the secondary signal path outside the inductive segments structure. These extrinsic capacitors are particularly appropriate for implementations in which extra coupling capacitance is needed besides the coupling capacitance formed inherently between the primary inductive segment and the secondary inductive segments, such as edge coupled lines implementation. Switches SW1-SW4 are configured to selectively switch the first and the second secondary inductive segments, $L_{2a}$ and $L_{2b}$, into the secondary signal path. The first and the second coupling capacitances, $C_{12a}$ and $C_{12b}$, are included in a total coupling capacitance when the first and the second secondary inductive segments, $L_{2a}$ and $L_{2b}$, are included in the secondary signal path. The second coupling capacitance $C_{12b}$ is substantially removed from the total coupling capacitance when the first secondary inductive segment $L_{2a}$ is included in the secondary signal path and the second secondary inductive segment $L_{2b}$ is excluded from the secondary signal path. Simultaneously, the mutual inductance between the primary and secondary inductive segments and the active inductance of the secondary inductive segments are reconfigured. Switches SW5-SW7 are configured to selectively switch the first or the second tunable impedance terminations, $Z_{T1}$ or $Z_{T2}$, into the secondary signal path to optimize directivity of the reconfigurable directional coupler 14. Switches SW1-SW7 are controlled by control signals CS1-CS7 of the control circuitry 16, respectively, based on a desired transmit band of operation.

The reconfigurable directional coupler 14 could operate in both forward and reverse power detection modes. When the coupler 14 receives a signal from the RF input port $RF_{in}$, a coupled signal is detected in the secondary signal path in the forward power detection modes. Herein, at least one of the secondary inductive segments, $L_{2a}$ and $L_{2b}$, is coupled between the coupled port COUPLED and a forward isolated port $ISO_{fwd}$. When the coupler 14 receives a signal from the RF output port $RF_{out}$ (such as from an antenna), a coupled signal is detected in the secondary signal path in the reverse power detection modes. Herein, at least one of the secondary inductive segments, L2a and L2b, is coupled between the coupled port COUPLED and one of reverse isolated ports, $ISO_{rev1}$ or $ISO_{rev2}$. If any of the secondary inductive segments, $L_{1a}$ or $L_{1b}$, are high impedance in any of the power detection modes, it is desirable to shunt this high impedance inductive segment, $L_{1a}$ or $L_{1b}$, to the ground to avoid large voltage swings on this high impedance node that may cause harmonic distortion. The resulting harmonic distortion may couple back to the main signal path. In this exemplary coupler, a shunt switch $SW_{sh}$ could be optionally placed between the ground and the connection node A of the second secondary inductive segment $L_{2b}$ and switch SW4 to selectively shunt the second secondary inductive segment $L_{2b}$ to the ground.

Table 1 lists the detailed switch settings for various high/low coupling capacitance and forward/reverse power detection modes.

TABLE 1

Switch Settings vs. Coupler Modes

| Coupler Mode | Switch Setting | | | | | | | |
|---|---|---|---|---|---|---|---|---|
| | SW1 | SW2 | SW3 | SW4 | SW5 | SW6 | SW7 | $SW_{sh}$ |
| high coupling capacitance forward power detection | open | open | closed | closed | closed | open | open | open |
| high coupling capacitance reverse power detection | closed | open | open | closed | open | closed | open | open |
| low coupling capacitance forward power detection | open | closed | open | open | closed | open | open | closed |
| low coupling capacitance reverse power detection | closed | open | open | open | open | open | closed | closed |

In the high coupling capacitance modes, the first and the second secondary inductive segments, $L_{2a}$ and $L_{2b}$, are switched in series into the secondary signal path. The total coupling capacitance is formed between the primary inductive segment $L_1$ and the secondary inductive segments, $L_{2a}$ and $L_{2b}$, by the sum of the first and the second coupling capacitances, $C_{12a}$ and $C_{12b}$. In the low coupling capacitance modes, the second secondary inductive segment $L_{2b}$ is switched out of the secondary signal path by opening switch SW4 and shunted to the ground by closing the shunt switch $SW_{sh}$. As a consequence, the second coupling capacitance $C_{12b}$ is substantially removed from the total coupling capacitance without large voltage swings at the connection node A. Changes in the total coupling capacitance and the power detection direction are desired to be accompanied by a change in termination impedance in order to maintain good directivity of the coupler. The first or the second tunable impedance terminations, $Z_{T1}$ or $Z_{T2}$, which is in the secondary signal path, is tuned in value based on the power detection mode of the coupler 14.

As shown in equation (3) above, both the operating frequency and the coupling capacitance have an inverse relation with the coupling factor. Therefore, when the coupler operates in a high frequency transmit band, i.e. band 43 at 3.8 GHz, the coupling factor can be compensated for by reducing the total coupling capacitance value. In this embodiment, when the coupler operates in a high frequency transmit band, the second secondary inductive segment $L_{2b}$ could be switched out of the secondary signal path to reduce the total coupling capacitance and the coupling factor of the coupler could still be in the desired range. Generally speaking, the high coupling capacitance modes are used in the low frequency transmit band and the low coupling capacitance modes are used in the high frequency transmit band.

Figure 2B:
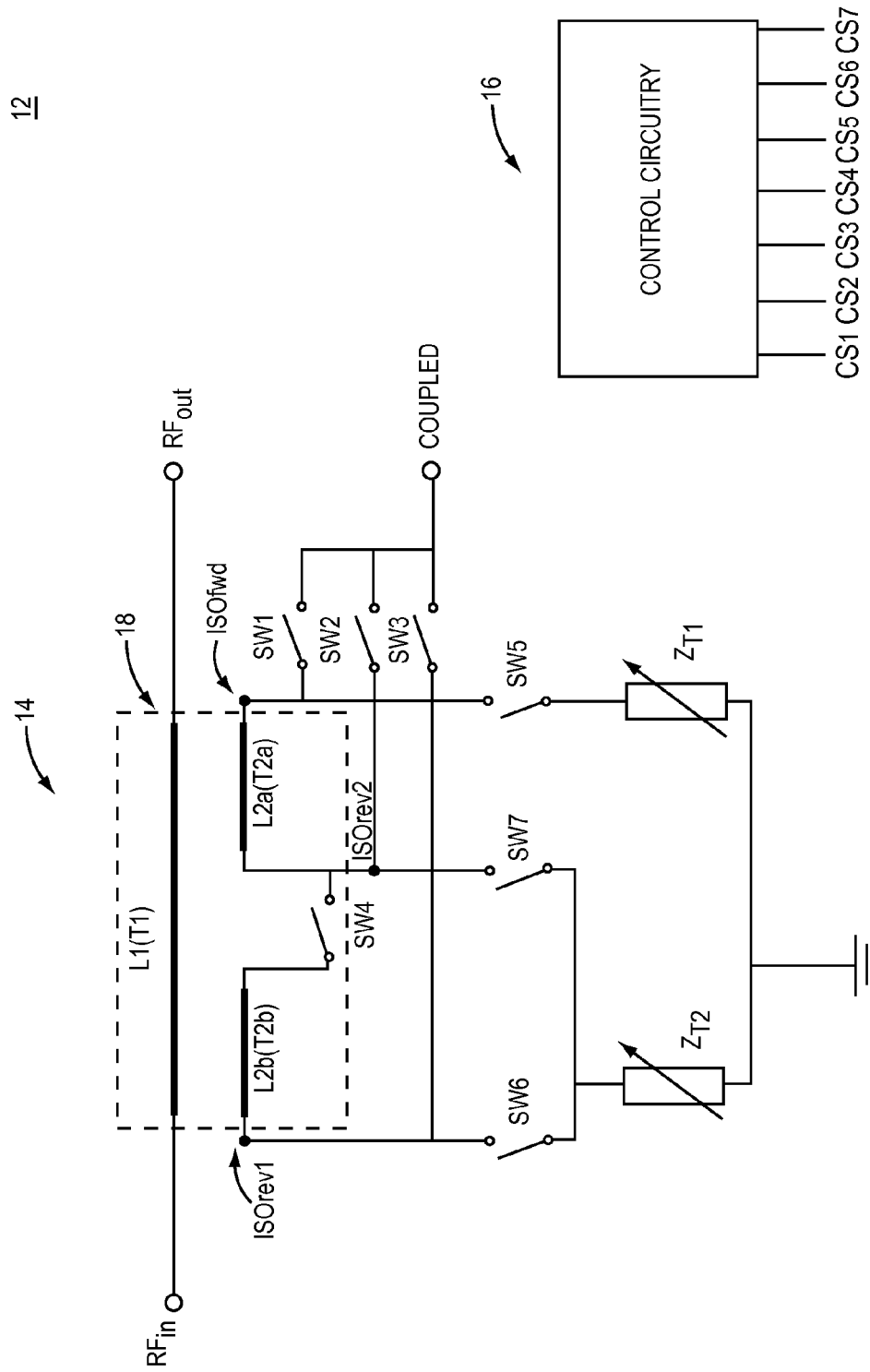

The primary inductive segment $L_1$, the first secondary inductive segment $L_{2a}$ and the second secondary inductive segment $L_{2b}$ are preferred to be implemented by broadside-coupled lines $T_1$, $T_{2a}$ and $T_{2b}$, respectively, as shown in FIG. 2B. The broadside-coupled lines structure leads to high mutual coupling between the first and the second inductive segments and low implementation cost.

Figure 3A:
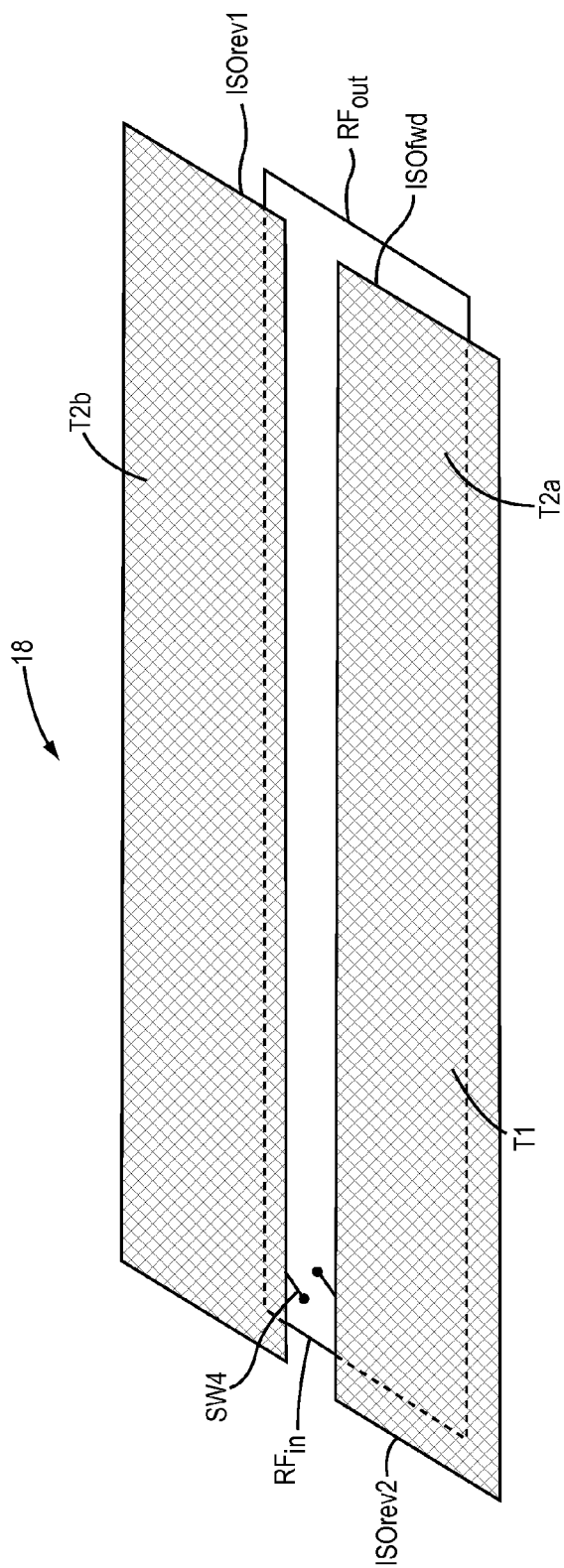
FIGS. 3A and 3B show layout diagrams to implement the coupler structure shown in FIG. 2B.
Figure 3B:
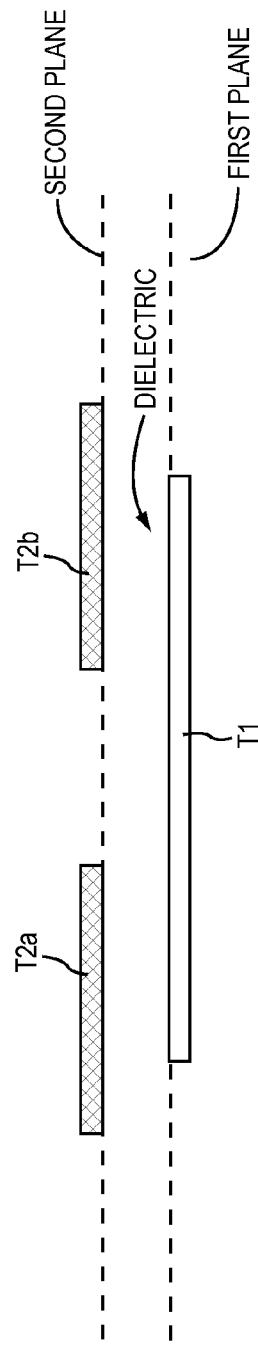

FIGS. 3A and 3B show layout diagrams to implement inductive segments 18 of the reconfigurable directional coupler 14 in FIG. 2B. FIG. 3A shows a primary inductive segment $T_1$, a first secondary inductive segment $T_{2a}$, a second secondary inductive segment $T_{2b}$, switches SW4 position, a forward isolated port $ISO_{fwd}$, two reverse isolated ports, $ISO_{rev1}$ and $ISO_{rev2}$, an RF input port $RF_{in}$ and an RF output port $RF_{out}$. A portion of the first secondary inductive segment $T_{2a}$ resides over a first portion of the primary inductive segment $T_1$ and a first coupling capacitance is formed between the portion of the first secondary inductive segment $T_{2a}$ and the first portion of the primary inductive segment $T_1$. It is obvious to anyone skilled in the art that there is no essential difference if the first portion of the primary inductive segment $T_1$ resides over the portion of the first secondary inductive segment $T_{2a}$. In the present disclosure "resides over" is not limited to "overlay", and also can be interpreted as "underlay". A portion of the second secondary inductive segment $T_{2b}$ resides over a second portion of the primary inductive segment $T_1$ and a second coupling capacitance is formed between the portion of the second secondary inductive segment $T_{2b}$ and the second portion of the primary inductive segment $T_1$. The first and the second secondary inductive segments, $T_{2a}$ and $T_{2b}$, are adjacent one another. FIG. 3B is a sectional view of FIG. 3A showing that the primary inductive segment $T_1$ is on a first plane, and the first and the second secondary inductive segments, $T_{2a}$ and $T_{2b}$, are on a second plane. The primary inductive segment $T_1$ and the secondary inductive segments, $T_{2a}$ and $T_{2b}$, are separated by a dielectric material.

Figure 4A:
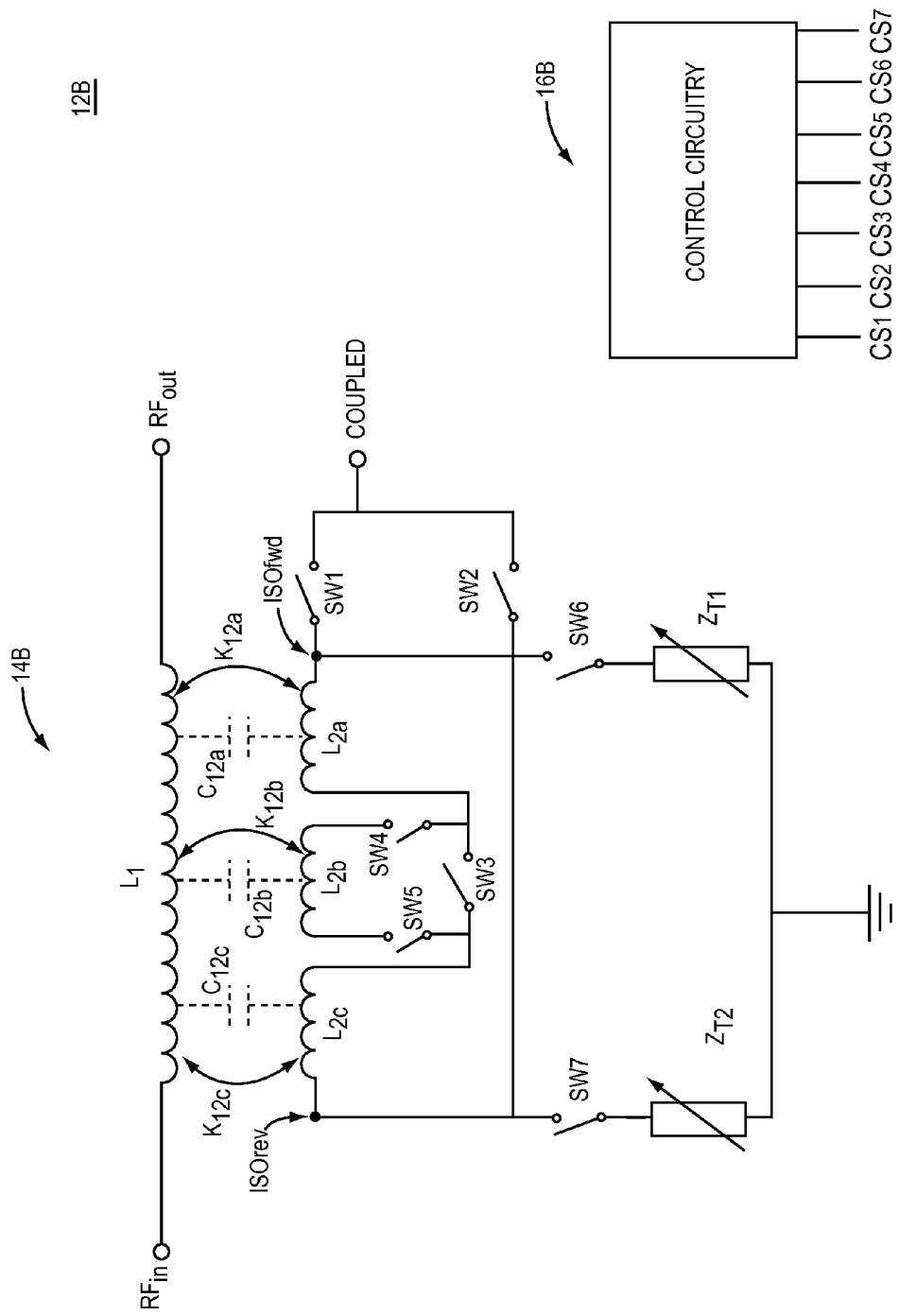
FIGS. 4A, 4B and 4C show alternative implementations of a coupler system with switchable secondary inductive segments.
Figure 4B:
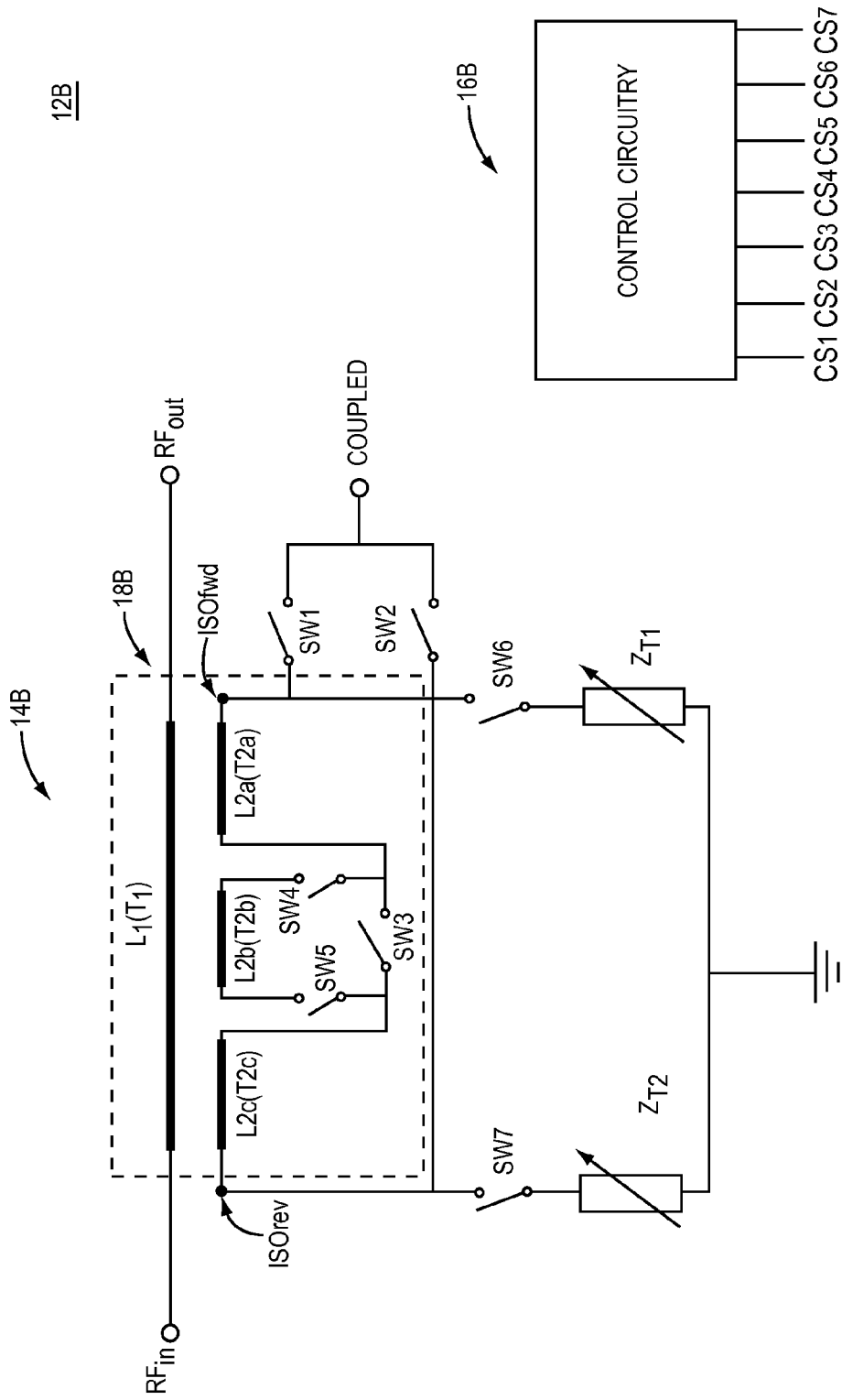
Figure 4C:
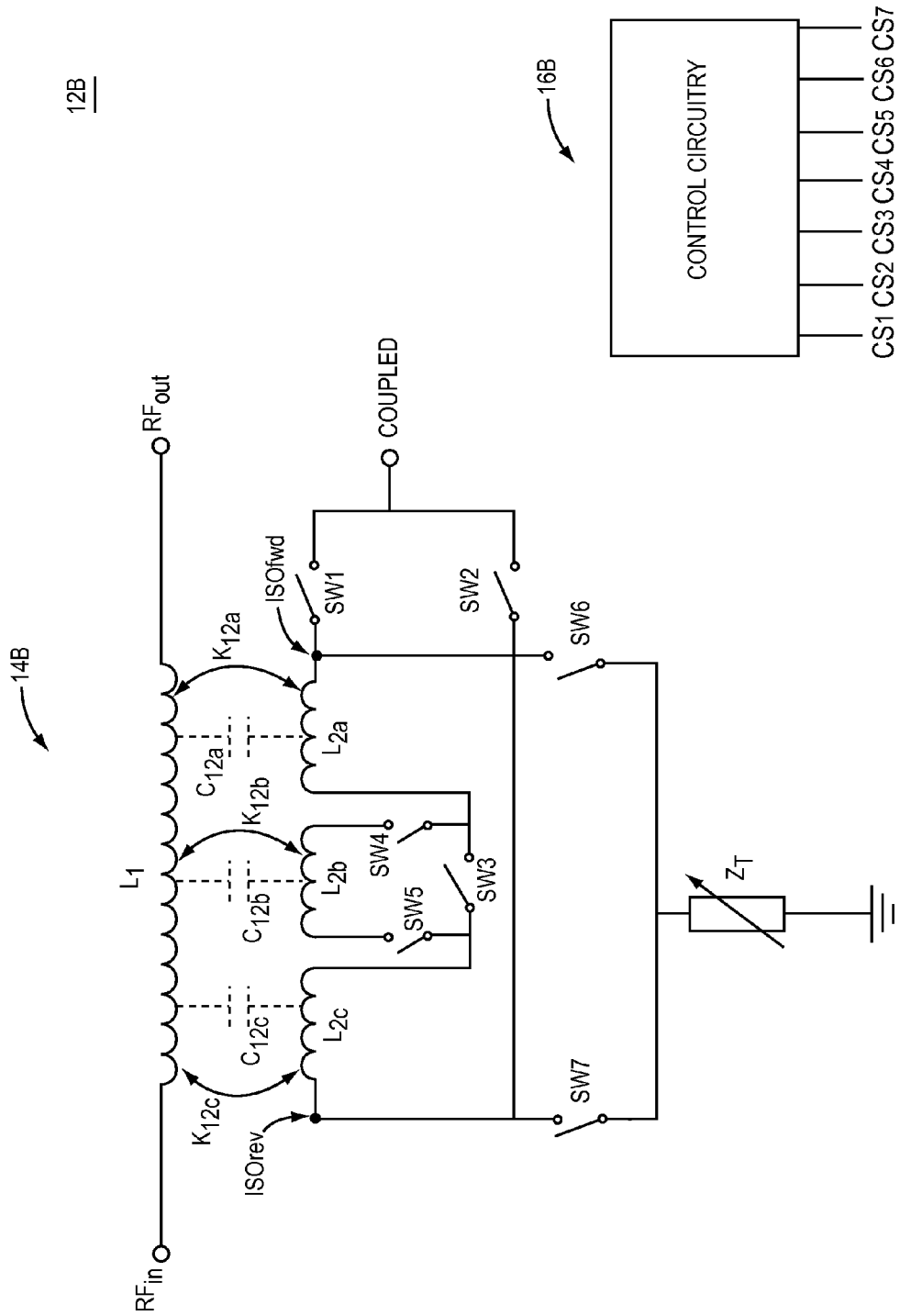

Alternative implementations of a coupler system with switchable secondary inductive segments are shown in FIGS. 4A, 4B, and 4C. In FIG. 4A, a coupler system 12B includes a reconfigurable directional coupler 14B and control circuitry 16B. A first secondary segment $L_{2a}$, a second secondary segment $L_{2b}$ and a third secondary segment $L_{2c}$ have relative lengths of 1:2:1 and relative inductances of 1:2:1, respectively. The total inductance of the secondary inductive segments, $L_{2a}$, $L_{2b}$ and $L_{2c}$, is approximately twice in value as inductance of a primary inductive segment $L_1$, wherein $L_{2a}+L_{2b}+L_{2c} \approx 2 \times L_1$. A first tunable impedance termination $Z_{T1}$ is used for forward power detection modes when at least one of the secondary inductive segments, $L_{2a}$, $L_{2b}$, and $L_{2c}$, is coupled between the coupled port COUPLED and a forward isolated port $ISO_{fwd}$. A second tunable impedance termination $Z_{T2}$ is used for reverse power detection modes when at least one of the secondary inductive segments, $L_{2a}$, $L_{2b}$, and $L_{2c}$, is coupled between the coupled port COUPLED and a reverse isolated port $ISO_{rev}$. A first coupling capacitance $C_{12a}$ is formed between the first secondary segment $L_{2a}$ and a first portion of the primary inductive segment $L_1$, a second coupling capacitance $C_{12b}$ is formed between the second secondary inductive segment $L_{2b}$ and a second portion of the primary inductive segment $L_1$ and a third coupling capacitance $C_{12c}$ is formed between the third secondary segment $L_{2c}$ and a third portion of the primary inductive segment $L_1$. Herein the relative coupling capacitances of $C_{12}a:C_{12}b:C_{12}c$ are 1:2:1. Switches SW1-SW5 are configured to selectively switch the first, the second and the third secondary inductive segments, $L_{2a}$, $L_{2b}$ and $L_{2c}$, into the secondary signal path. The first, the second and the third coupling capacitances, $C_{12a}$, $C_{12b}$ and $C_{12c}$, are included in a total coupling capacitance when the first, the second and the third secondary inductive segments, $L_{2a}$, $L_{2b}$ and $L_{2c}$, are included in the secondary signal path; and the second coupling capacitance $C_{12b}$ is substantially removed from the total coupling capacitance when the first and the third secondary inductive segments, $L_{2a}$ and $L_{2c}$, are included in the secondary signal path and the second secondary inductive segment $L_{2b}$ is excluded from the secondary signal path. Switches SW6-SW7 are configured to selectively switch the first or the second tunable impedance termination, $Z_{T1}$ or $Z_{T2}$, into the secondary signal path. The primary inductive segment $L_1$ is mutually coupled with the first, the second and the third secondary segments, $L_{2a}$, $L_{2b}$, and $L_{2c}$. A first mutual coupling $K_{12a}$, a second mutual coupling $K_{12b}$ and a third mutual coupling $K_{12c}$ are expected to be in the 0.7-0.9 range, which keeps the inductive segments values low, resulting in a small low loss structure.

Table 2 lists the detailed switch settings for various high/low coupling capacitance and forward/reverse power detection modes.

TABLE 2

Switch Settings vs. Coupler Modes

| Coupler Mode | Switch Setting | | | | | | |
| --- | --- | --- | --- | --- | --- | --- | --- |
| | SW1 | SW2 | SW3 | SW4 | SW5 | SW6 | SW7 |
| high coupling capacitance forward power detection | open | closed | open | closed | closed | closed | open |

TABLE 2-continued

Switch Settings vs. Coupler Modes

| Coupler Mode | Switch Setting | | | | | | |
|---|---|---|---|---|---|---|---|
| | SW1 | SW2 | SW3 | SW4 | SW5 | SW6 | SW7 |
| high coupling capacitance reverse power detection | closed | open | open | closed | closed | open | closed |
| low coupling capacitance forward power detection | open | closed | closed | open | open | closed | open |
| low coupling capacitance reverse power detection | closed | open | closed | open | open | open | closed |

In the high coupling capacitance modes, the first, the second and the third secondary inductive segments, $L_{2a}$, $L_{2b}$ and $L_{2c}$, are switched in series into the secondary signal path. The total coupling capacitance is formed between the primary inductive segment $L_1$ and the secondary inductive segments, $L_{2a}$, $L_{2b}$ and $L_{2c}$, by the sum of the first, the second and the third coupling capacitances, $C_{12a}$, $C_{12b}$ and $C_{12c}$. In the low coupling capacitance modes, the first and the third secondary inductive segments, $L_{2a}$ and $L_{2c}$, are switched in series into the secondary signal path and the second secondary inductive segment $L_{2b}$ is switched out of the secondary signal path. The coupled signal is then only routed through the first and the third secondary inductive segments, $L_{2a}$ and $L_{2c}$, and the total coupling capacitance substantially reduces to the sum of the first and the third coupling capacitances, $C_{12a}$ and $C_{12c}$. The second coupling capacitance $C_{12b}$ is now isolated from the secondary signal path. The total coupling capacitance in the low coupling capacitance modes is substantially twice in value as the total coupling capacitance in the high coupling capacitance modes, resulting in substantially a 6 dB difference in the coupling factor. When the tunable impedance termination, $Z_{T1}$ or $Z_{T2}$, is tuned for high directivity, the coupling factor difference is substantially 5 dB.

Clearly, the inductance ratio of the primary inductive segment $L_1$ to the secondary inductive segments, $L_{2a}$, $L_{2b}$ and $L_{2c}$, does not need to be 1:2. The 1:2 ratio is an exemplary embodiment, although the technique also works with different inductance ratios. If different variations in coupling factor are required, the first, the second and the third coupling capacitances, $C_{12a}$, $C_{12b}$, and $C_{12c}$, can be scaled by adjusting either the width or the length of the secondary inductive segments $L_{2a}$, $L_{2b}$ and $L_{2c}$.

The primary inductive segment $L_1$, the first, the second and the third secondary inductive segments, $L_{1a}$, $L_{2b}$ and $L_{2c}$, can be implemented by broadside-coupled lines $T_1$, $T_{2a}$, $T2b$ and $T_{2c}$, respectively, as shown in FIG. 4B.

With the switch between the high and low capacitance modes, the termination impedance needs to be tuned. It is likely that the termination impedance required in forward and reverse power detection modes will be different. It is obvious to anyone skilled in the art that it is also possible to combine the first and the second tunable impedance terminations, $Z_{T1}$ and $Z_{T2}$, into a single tunable impedance termination $Z_T$, as shown in FIG. 4C. The single tunable impedance termination $Z_T$ is tuned in value based on the power detection mode of the coupler 14B. The choice between whether or not to share the tunable impedance termination is primarily driven by layout considerations.

Figure 5:
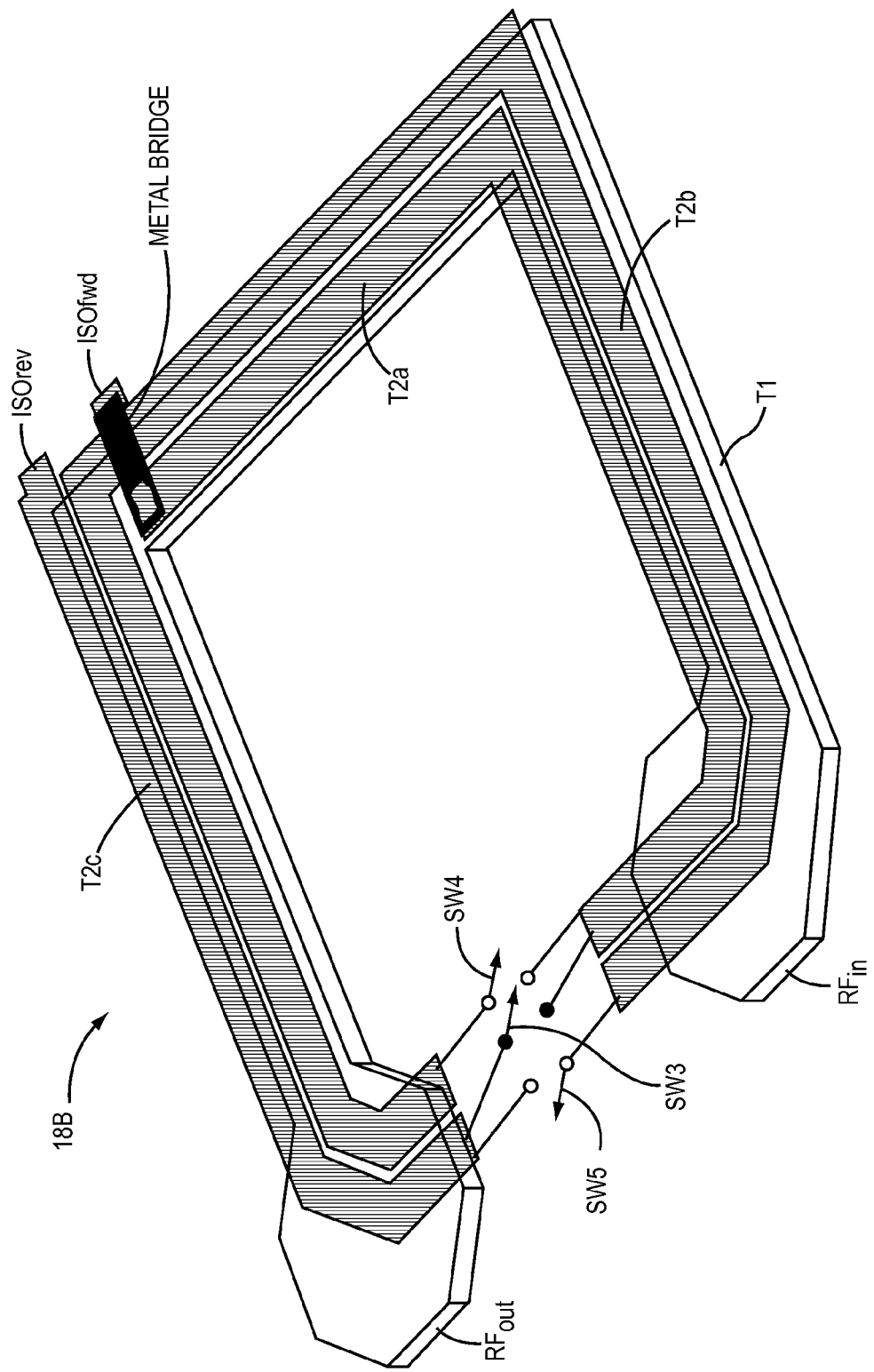
FIG. 5 shows a layout diagram to implement the coupler structure shown in FIG. 4B.

FIG. 5 shows a layout diagram to implement inductive segments 18B of the reconfigurable directional coupler 14B shown in FIG. 4B. The layout diagram shows a primary inductive segment $T_1$, a first secondary inductive segment $T_{2a}$, a second secondary inductive segment $T_{2b}$, a third secondary inductive segment $T_{2c}$, switch (Sw3, Sw4, and Sw5) positions, a forward isolated port $ISO_{fwd}$, a reverse isolated port $ISO_{rev}$, a metal bridge used to connect the first secondary inductive segment $T_{2a}$ with the a reverse isolated port $ISO_{rev}$, an RF input port $RF_{in}$ and an RF output port $RF_{out}$. The first secondary inductive segment $T_{2a}$ resides over a first portion of the primary inductive segment $T_1$ and a first coupling capacitance is formed between the first secondary inductive segment $T_{2a}$ and the first portion of the primary inductive segment $T_1$. The second secondary inductive segment $T_{2b}$ resides over a second portion of the primary inductive segment $T_1$ and a second coupling capacitance is formed between the second secondary inductive segment $T_{2b}$ and the second portion of the primary inductive segment $T_1$. The third secondary inductive segment $T_{2c}$ resides over a third portion of the primary inductive segment $T_1$ and a third coupling capacitance is formed between the third secondary inductive segment $T_{2c}$ and the third portion of the primary inductive segment $T_1$. The primary inductive segment $T_1$ is a substantially U-shaped trace. The second secondary inductive segment $T_{2b}$ is adjacent to the first secondary inductive segment $T_{2a}$ and the third secondary inductive segment $T_{2c}$. Essentially all of the first, the second and the third inductive segments, $T_{2a}$, $T_{2b}$ and $T_{2c}$ reside over the primary inductive segment $L_1$. The total coupling capacitance when SW3 is open and SW4 and SW5 are closed is twice in value as the total coupling capacitance when SW3 is closed and SW4 and SW5 are open.

Figure 6:
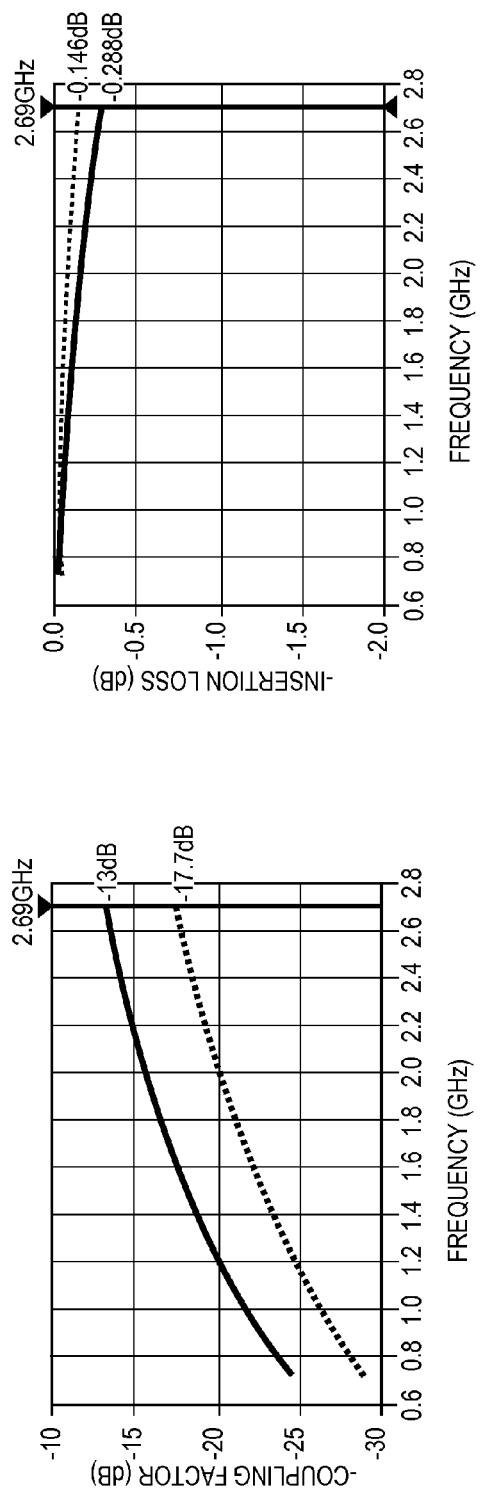
FIG. 6 shows Electromagnetic (EM) simulation results of coupling factors, insertion loss and directivity based on the coupler system shown in FIG. 4B.
Figure 6:
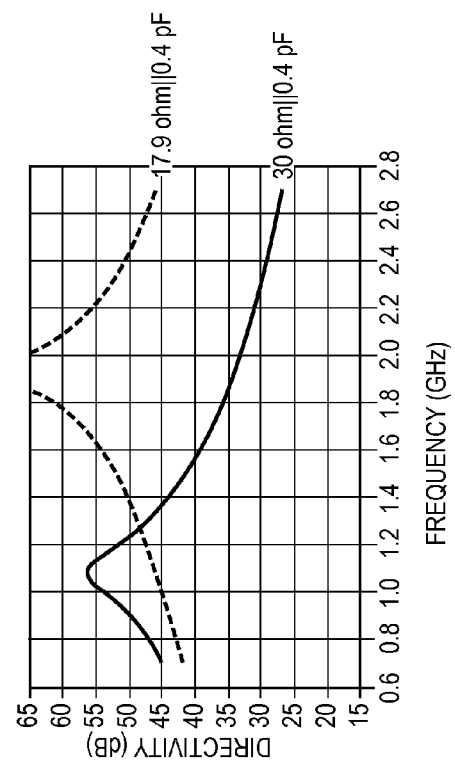

FIG. 6 shows the Electromagnetic (EM) simulation results of the coupling factor, insertion loss and directivity based on the coupler system shown in FIG. 4B. For illustration purposes, the simulation results of the coupling factor and insertion loss are shown in negative values. The coupling factor results indicate an achievement of about a 5 dB increase from the high coupling capacitance mode (solid line) to the low coupling capacitance mode (dashed line) at the same operating frequency. At 2.69 GHz, the coupling factor increases from 13 dB in the high coupling capacitance mode (solid line) to 17.7 dB in the low coupling capacitance mode (dashed line). Similarly, the insertion loss decreases from the high coupling capacitance mode (solid line) to the low coupling capacitance mode (dashed line) at the same operating frequency. At 2.69 GHz, the insertion loss decreases from 0.288 dB in the high coupling capacitance mode (solid line) to 0.146 dB in the low coupling capacitance mode (dashed line) because of the coupling factor increase from 13 dB to 17.7 dB. The directivity of the coupler is maintained at >25 dB in the frequency range of interest by tuning the termination impedances from 30 ohm∥0.6 pF in the high coupling capacitance mode (solid line) to 17.9 ohms∥0.4 pF in the low coupling capacitance mode (dashed line).

Figure 7:
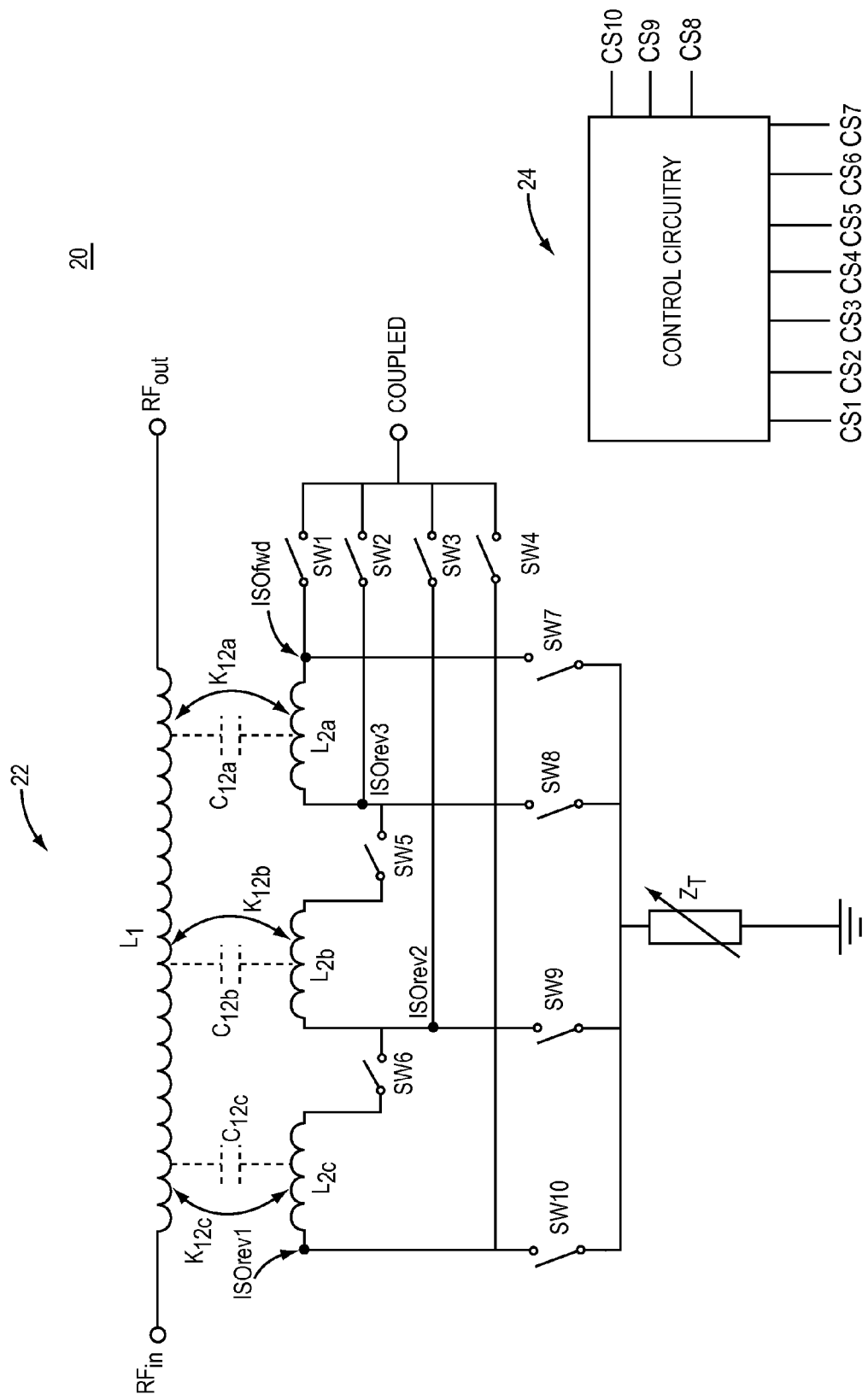
FIG. 7 shows an exemplary coupler system with three secondary inductive segments.

The reconfigurable directional coupler can be extended to have more segments of the secondary inductive segment and provide more switchable coupling factor states. FIG. 7 shows a coupler system 20 including a reconfigurable directional coupler 22 and control circuitry 24. The reconfigurable directional coupler 22 includes three secondary inductive segments: a first secondary inductive segment $L_{2a}$, a second secondary inductive segment $L_{2b}$ and a third secondary inductive segment $L_{2c}$. A first coupling capacitance $C_{12a}$ is formed between a first secondary segment $L_{2a}$ and a first portion of the primary inductive segment $L_1$, a second coupling capacitance $C_{12b}$ is formed between the second secondary segment $L_{2b}$ and a second portion of the primary inductive segment $L_1$ and a third coupling capacitance $C_{12c}$ is formed between the third secondary segment $L_{2c}$ and a third portion of the primary inductive segment $L_1$. The primary inductive segment $L_1$ is mutually coupled with the first, the second and the third secondary segments, $L_{2a}$, $L_{2b}$, and $L_{2c}$. A first mutual coupling $K_{12a}$, a second mutual coupling $K_{12b}$ and a third mutual coupling $K_{12c}$ are expected to be in the 0.7-0.9 range, which keeps the inductive segments values low, resulting in a small low loss structure. When the reconfigurable directional coupler 22 operates in a low-frequency transmit band (i.e. band 12 with 699 MHz), high coupling capacitance modes are used. The first, the second, and the third secondary inductive segments, $L_{2a}$, $L_{2b}$, and $L_{2c}$, are switched into the secondary signal path. A total coupling capacitance is formed between the primary inductive segment $L_1$ and the secondary inductive segments, $L_{2a}$, $L_{2b}$ and $L_{2c}$, by the sum of the first, the second and the third coupling capacitances, $C_{12a}$, $C_{12b}$ and $C_{12c}$. When the reconfigurable directional coupler 22 operates in a mid-frequency transmit band (i.e. band 33 with 1.92 GHz), mid coupling capacitance modes are used. The coupling factor can be compensated by switching the third secondary segment $L_{2c}$ out of the secondary signal path to substantially reduce the total coupling capacitance to the sum of the first and the second coupling capacitances, $C_{12a}$ and $C_{12b}$. When the reconfigurable directional coupler 22 operates in a high-frequency transmit band (i.e. band 43 with 3.8 GHz), low coupling capacitance modes are used. The coupling factor can be compensated by switching the second and third secondary segments, $L_{2b}$ and $L_{2c}$, out of the secondary signal path to substantially reduce the total coupling capacitance to the first coupling capacitance $C_{12a}$. As such, the coupling factor of the reconfigurable directional coupler 22 could always be in a desired range (see equation (3)).

The reconfigurable directional coupler 22 could also operate in both forward and reverse power detection modes. When the coupler 22 receives a signal from the RF input port $RF_{in}$, a coupled signal is detected in the secondary signal path in the forward power detection modes. Herein, at least one of the secondary inductive segments, $L_{2a}$, $L_{2b}$, and $L_{2c}$, is coupled between the coupled port COUPLED and a forward isolated port $ISO_{fwd}$. When the coupler 22 receives a signal from the RF output port $RF_{out}$, a coupled signal is detected in the secondary signal path in the reverse power detection modes. Herein, at least one of the secondary inductive segments, $L_{2a}$, $L_{2b}$, and $L_{2c}$, is coupled between the coupled port COUPLED and one of reverse isolated ports, $ISO_{rev1}$, $ISO_{rev2}$, or $ISO_{rev3}$.

Table 3 lists the detailed switch settings for the various high/mid/low coupling capacitance and forward/reverse power detection modes.

TABLE 3

Switch Settings vs. Coupler Modes

| Coupler Mode | SW1 | SW2 | SW3 | SW4 | SW5 | SW6 | SW7 | SW8 | SW9 | SW10 |
|---|---|---|---|---|---|---|---|---|---|---|
| high coupling capacitance forward power detection | open | open | open | closed | closed | closed | closed | open | open | open |
| high coupling capacitance reverse power detection | closed | open | open | open | closed | closed | open | open | open | closed |
| mid coupling capacitance forward power detection | open | open | closed | open | closed | open | closed | open | open | open |
| mid coupling capacitance reverse power detection | closed | open | open | open | closed | open | open | open | closed | open |
| low coupling capacitance forward power detection | open | closed | open | open | open | open | closed | open | open | open |
| Low coupling capacitance reverse power detection | closed | open | open | open | open | open | open | closed | open | open |

Switches SW1-SW6 are configured to selectively switch the first, the second and the third secondary inductive segments, $L_{2a}$, $L_{2b}$ and $L_{2c}$, into the secondary signal path. Switches SW7-SW10 are configured to select forward or reverse power detection modes. Switches SW1-SW10 are controlled by control signals CS1-CS10 of the control circuitry 24, respectively, based on a desired transmit band of operation.

Switchable Cascaded Coupler

Figure 8A:
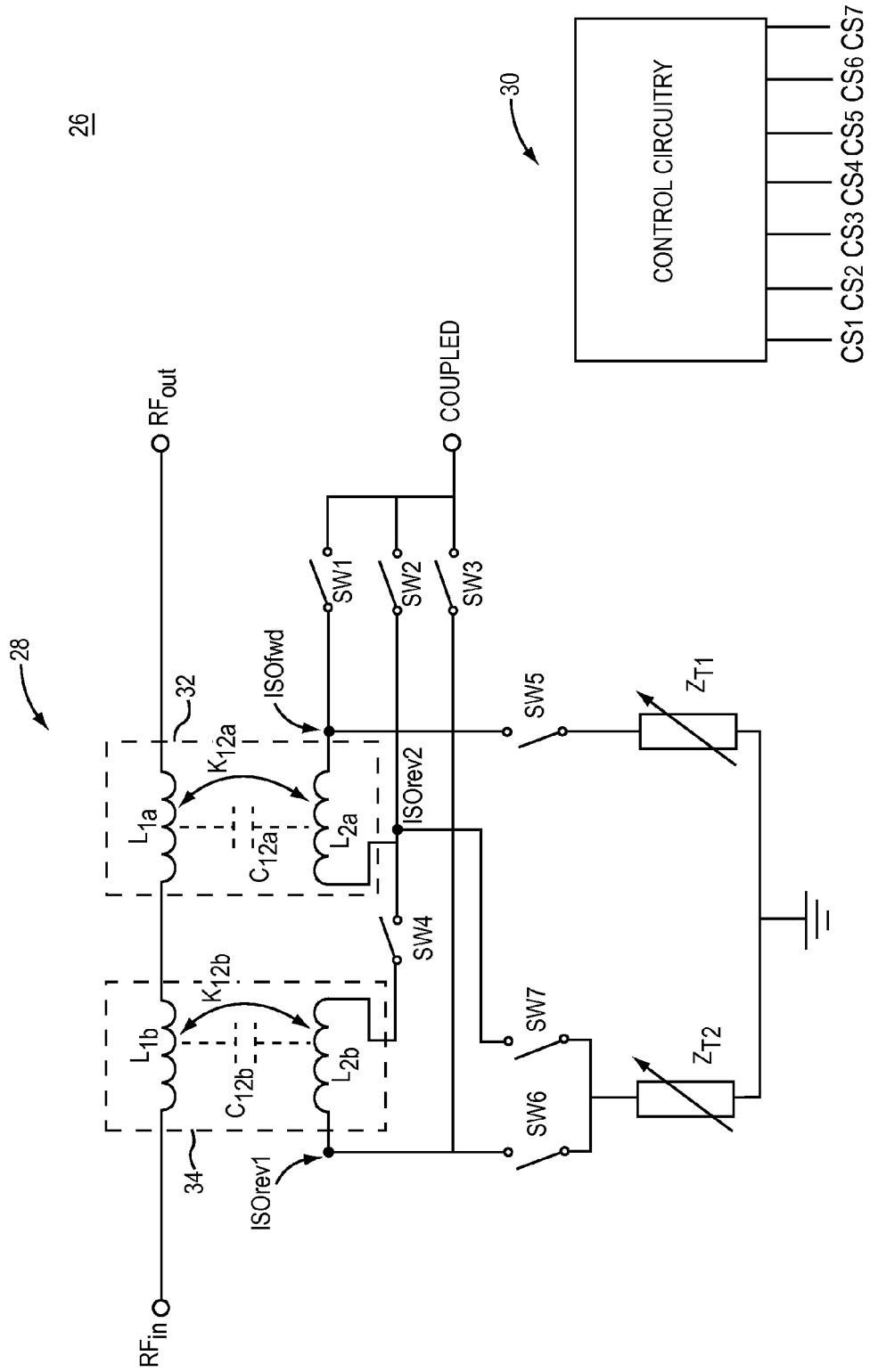
FIGS. 8A, 8B and 8C show an exemplary coupler system with switchable cascaded structure.
Figure 8B:
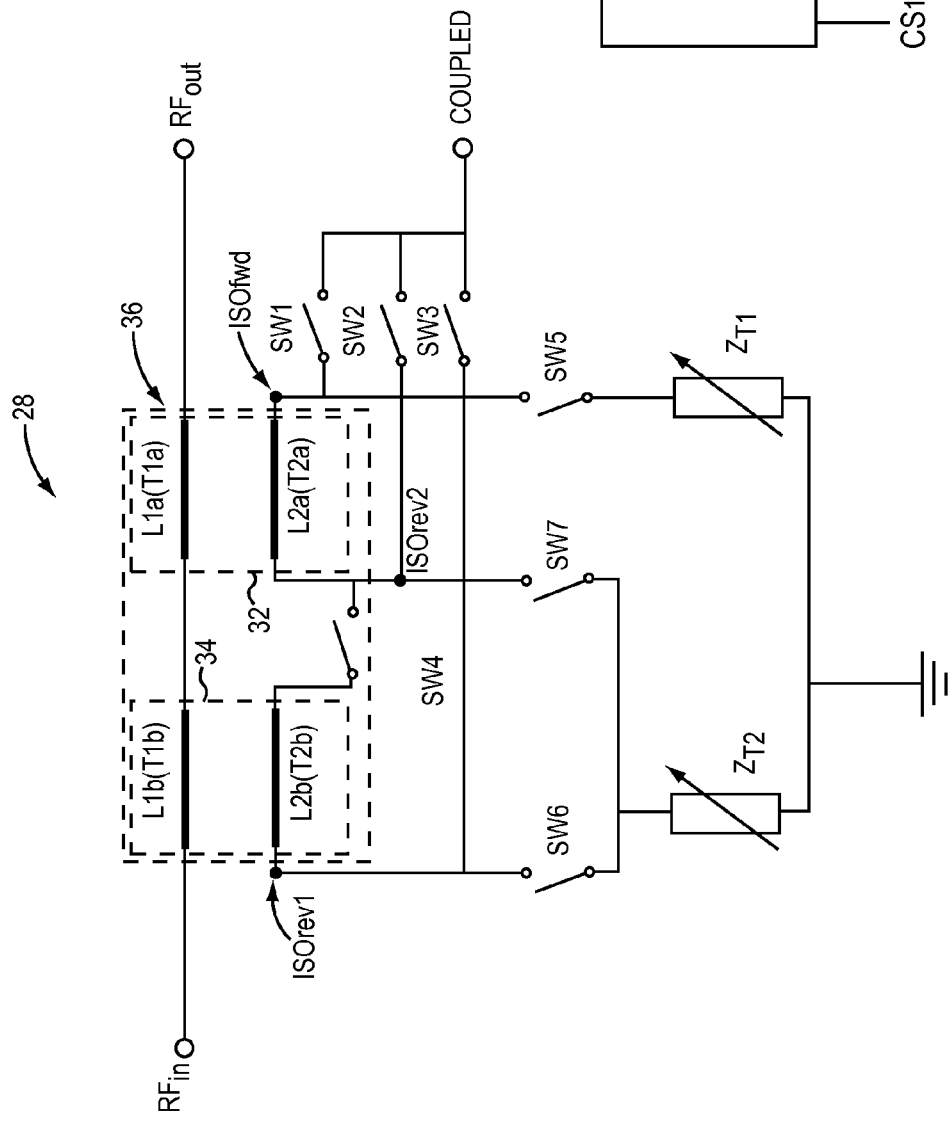
Figure 8C:
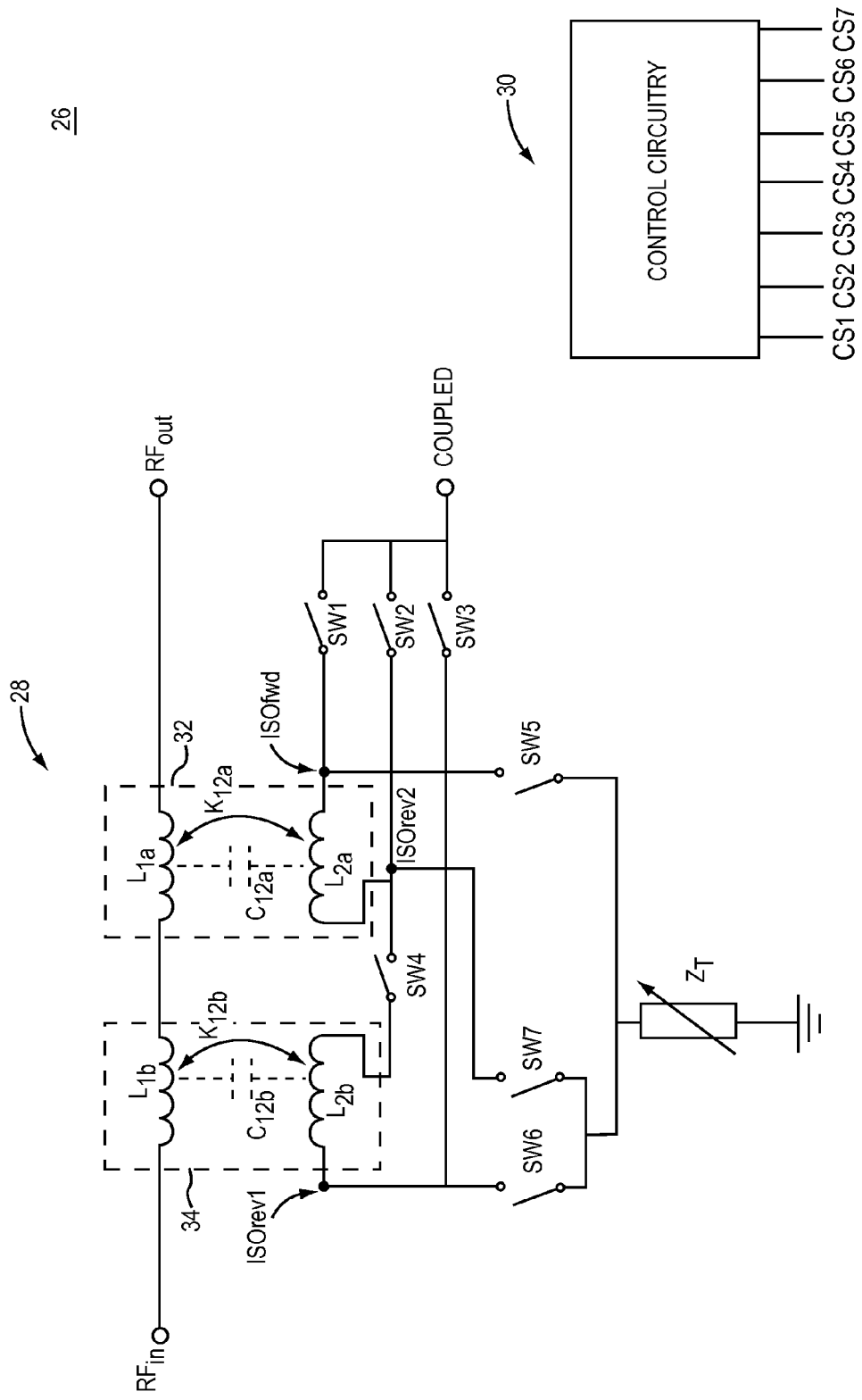

A second embodiment of the present disclosure implements a reconfigurable directional coupler as a switchable cascade of two separate coupler sections as shown in FIGS. 8A, 8B and 8C.

In FIG. 8A, a coupler system 26 includes a reconfigurable directional coupler 28 and control circuitry 30. The reconfigurable directional coupler 28 includes a first coupler section 32 comprising a first primary inductive segment $L_{1a}$ mutually coupled with a first secondary inductive segment $L_{2a}$, a second coupler section 34 comprising a second primary inductive segment $L_{1b}$ mutually coupled with a second secondary inductive segment $L_{2b}$, a main signal path that extends between an RF input port $RF_{in}$ and an RF output port $RF_{out}$ and includes the first primary inductive segment $L_{1a}$ and the second primary inductive segment $L_{1b}$, a secondary signal path that extends between a coupled port COUPLED and ground, switch circuitry (Sw1-Sw7), a first tunable impedance termination $Z_{T1}$ and a second tunable impedance termination $Z_{T2}$. A first coupling capacitance $C_{12a}$ is formed between the first primary inductive segment $L_{1a}$ and the first secondary inductive segment $L_{2a}$, and a second coupling capacitance $C_{12b}$ is formed between the second primary inductive segment $L_{1b}$ and the second secondary inductive segment $L_{2b}$. A first mutual coupling $K_{12a}$ between the first primary inductive segment $L_{1a}$ and the first secondary inductive segment $L_{2a}$, and a second mutual coupling $K_{12b}$ between the second primary inductive segment $L_{1b}$ and the second secondary inductive segment $L_{2b}$ are expected to be in the 0.7-0.9 range, which keeps the inductive segments values low, resulting in a small low loss structure. Switches SW1-SW4 are configured to selectively switch the first and the second secondary inductive segments, $L_{2a}$ and $L_{2b}$, into the secondary signal path. The first and the second coupling capacitances, $C_{12a}$ and $C_{12b}$, are included in a total coupling capacitance when the first and the second secondary inductive segments, $L_{2a}$ and $L_{2b}$, are included in the secondary signal path. The second coupling capacitance $C_{12b}$ is substantially removed from the total coupling capacitance when the first secondary inductive segment $L_{2a}$ is included in the secondary signal path and the second secondary inductive segment $L_{2b}$ is excluded from the secondary signal path. Sw5-Sw7 switches are configured to selectively switch the first or the second tunable impedance termination, $Z_{T1}$ or $Z_{T2}$, into the secondary signal path to optimize directivity of the coupler 28.

The control circuitry 30 controls the switch circuitry based on a desired transmit band of operation. When the coupler operates in a low-frequency transmit band (i.e. band 12 with 699 MHz), the control circuitry 30 closes SW4 to switch the first and the second secondary inductive segments, $L_{2a}$ and $L_{2b}$, into the secondary signal path. The total coupling capacitance of the coupler is formed by the sum of the first and the second coupling capacitances, $C_{12a}$ and $C_{12b}$. When the coupler operates in a high-frequency transmit band (i.e. band 43 with 3.8 GHz), the control circuitry 30 opens SW4 to switch the second secondary inductive segment $L_{2b}$ out of the secondary signal path. The total coupling capacitance substantially reduces to the first coupling capacitance, $C_{12a}$.

As shown in equation (3), when the coupler operates in a high frequency transmit band, the coupling factor can be compensated by reducing the total coupling capacitance value. As such, the coupling factor of the reconfigurable directional coupler could always be in a desired range. Generally speaking, the high coupling capacitance modes are used in low frequency transmit band and the low coupling capacitance modes are used in high frequency transmit band. Table 4 lists the detailed switch settings for the various high/mid/low coupling capacitance and forward/reverse power detection modes.

TABLE 4

Switch Settings vs. Coupler Mode

| Coupler Mode | SW1 | SW2 | SW3 | SW4 | SW5 | SW6 | SW7 |
|---|---|---|---|---|---|---|---|
| high coupling capacitance forward power detection | open | open | closed | closed | closed | open | open |
| high coupling capacitance reverse power detection | closed | open | open | closed | open | open | closed |
| low coupling capacitance forward power detection | open | closed | open | open | closed | open | open |
| low coupling capacitance reverse power detection | closed | open | open | open | open | closed | open |

In one embodiment, it is easy to notice that there is no switching included in the main signal path because the insertion loss savings of removing part of the primary inductive segment would be outweighed by the additional loss of a series switch. The unused coupler section does not provide coupling capacitance, but behaves as a series inductor in the main signal path. This small amount of inductance can compensate for capacitive mismatch loss and improve the return loss of the overall coupler structure.

The first and the second primary inductive segment, $L_{1a}$ and $L_{1b}$, and the first and the second secondary inductive segments, $L_{2a}$ and $L_{2b}$, can be implemented by broadside-coupled lines, $T_{1a}$, $T_{1b}$, $T_{2a}$, and $T_{2b}$, respectively, as shown in FIG. 8B.

With the switch between the high and low capacitance modes, the termination impedance needs to be tuned. It is likely that the termination impedance required in forward and reverse power detection modes will be different. It is obvious to anyone skilled in the art that it is also possible to combine the first and the second tunable impedance terminations, $Z_{T1}$ and $Z_{T2}$, into a single tunable impedance termination $Z_T$, as shown in FIG. 8C. The choice between whether or not to share the tunable impedance termination is primarily driven by layout considerations.

Figure 9:
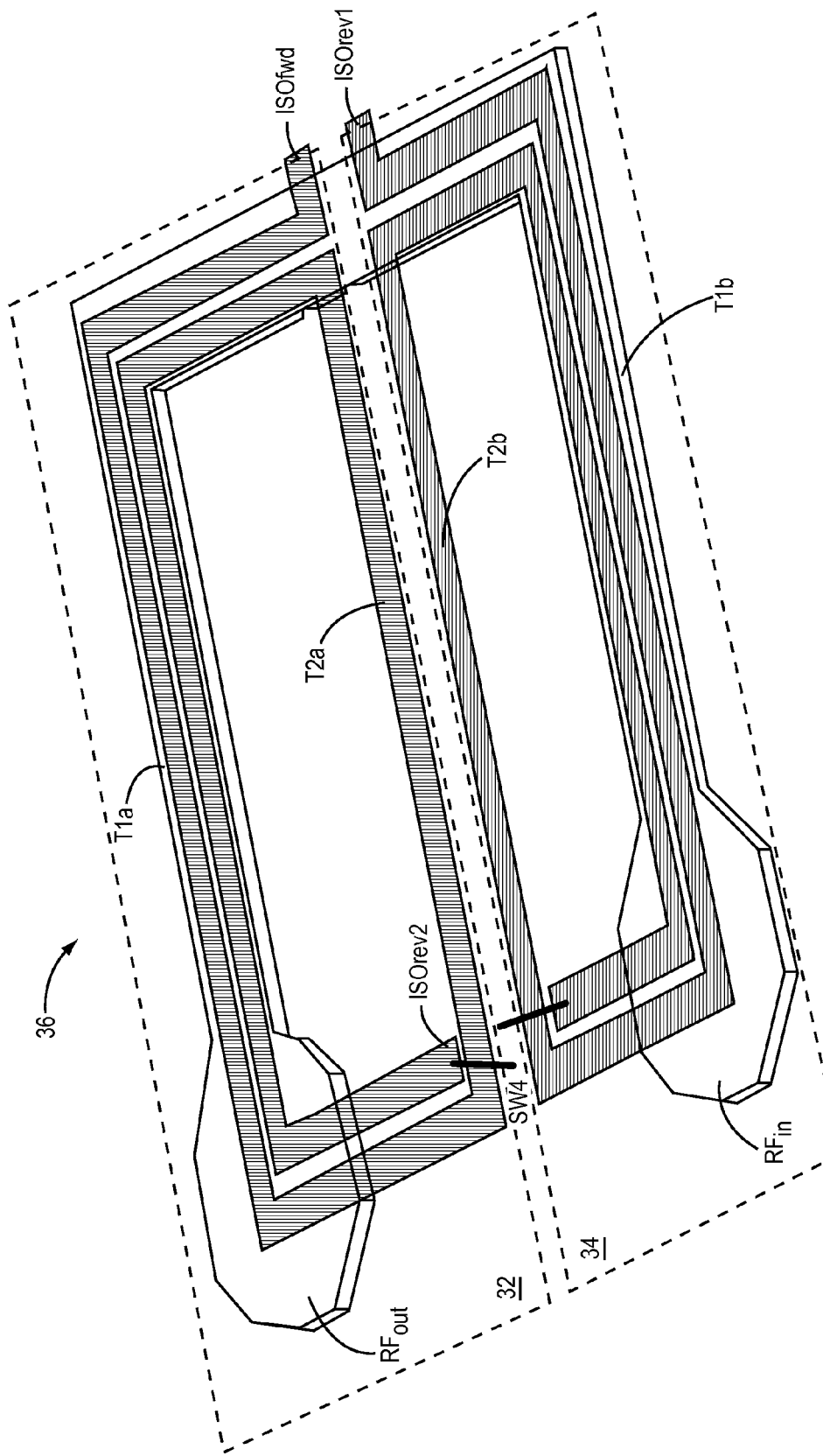
FIG. 9 shows a layout diagram to implement the coupler structure shown in FIG. 8B.

FIG. 9 shows a layout diagram to implement inductive segments 36 of the coupler 28 shown in FIG. 8B. The layout diagram shows a first coupler section 32 comprising a first primary inductive segment $T_{1a}$ and a first secondary inductive segment $T_{2a}$, a second coupler section 34 comprising a second primary inductive segment $T_{1b}$ and a second secondary inductive segment $T_{2b}$, switch SW4 position, a forward isolated port $ISO_{fwd}$, two reverse isolated ports, $ISO_{rev1}$ and $ISO_{rev2}$, an RF input port $RF_{in}$ and an RF output port $RF_{out}$. The first and second primary inductive segments $T_{1a}$ and $T_{1b}$, are formed from a substantially U-shaped trace. A first portion of the first secondary inductive segment $T_{2a}$ resides over the first primary inductive segment $T_{1a}$ and a first coupling capacitance is formed between the first portion of the first secondary inductive segment $T_{2a}$ and the first primary inductive segment $T_{1a}$. A first portion of the second secondary inductive segment $T_{2b}$ resides over the second primary inductive segment $T_{1b}$ and a second coupling capacitance is formed between the first portion of the second secondary inductive segment $T_{2b}$ and the second primary inductive segment $T_{1b}$. A second portion of the first secondary inductive segment $T_{2a}$ does not reside over the first primary inductive segment $T_{1a}$ and a second portion of the second secondary inductive segment $T_{2b}$ does not reside over the second primary inductive segment $T_{1b}$. In addition, the first secondary inductive segment $T_{2a}$ does not overlap the second primary inductive segment $T_{1b}$ and the second secondary inductive segment $T_{2b}$ does not overlap the first primary inductive segment $T_{1a}$. The total coupling capacitance when SW4 is closed is twice in value as the total coupling capacitance when SW4 is open.

Figure 10:
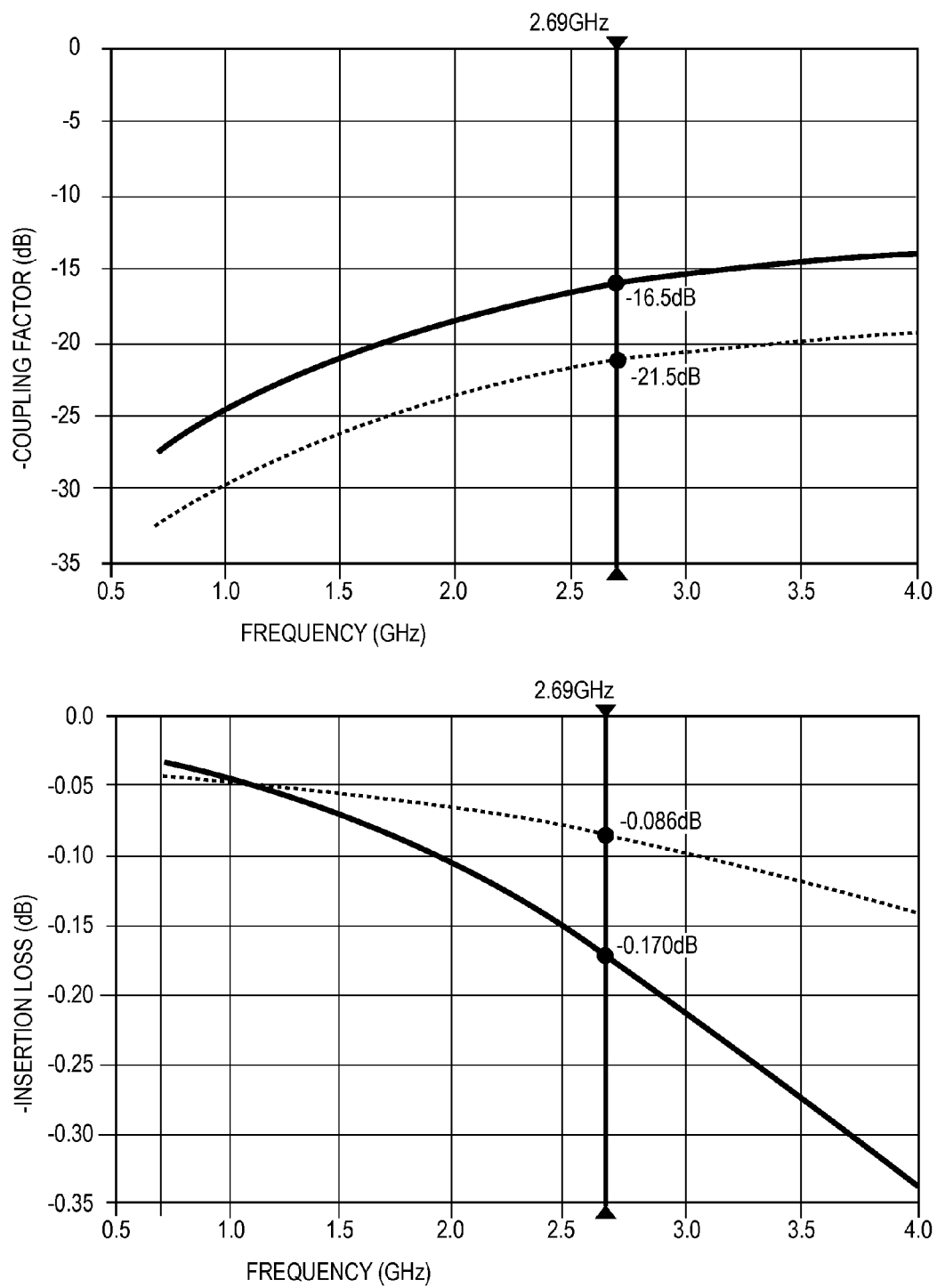
FIG. 10 shows EM simulation results of coupling factors and insertion loss based on the coupler system shown of FIG. 8B.

FIG. 10 shows the EM simulation results of the coupling factor and insertion loss based on the coupler system shown in FIG. 8B. For illustration purposes, the simulation results of the coupling factor and insertion loss are shown in negative values. The coupling factor results indicate an achievement of about a 5 dB increase from the high coupling capacitance mode (solid line) to the low coupling capacitance mode (dashed line) at the same operating frequency. At 2.69 GHz, the coupling factor increases from 16.5 dB in the high coupling capacitance mode (solid line) to 21.5 dB in the low coupling capacitance mode (dashed line). Similarly, the insertion loss will decrease from the high coupling capacitance mode (solid line) to the low coupling capacitance mode (dashed line) at the same operating frequency. At 2.69 GHz, the insertion loss decreases from 0.170 dB in the high coupling capacitance mode (solid line) to 0.084 dB in the low coupling capacitance mode (dashed line) because of the increase in the coupling factor from 16.5 dB to 21.5 dB.

Figure 11:
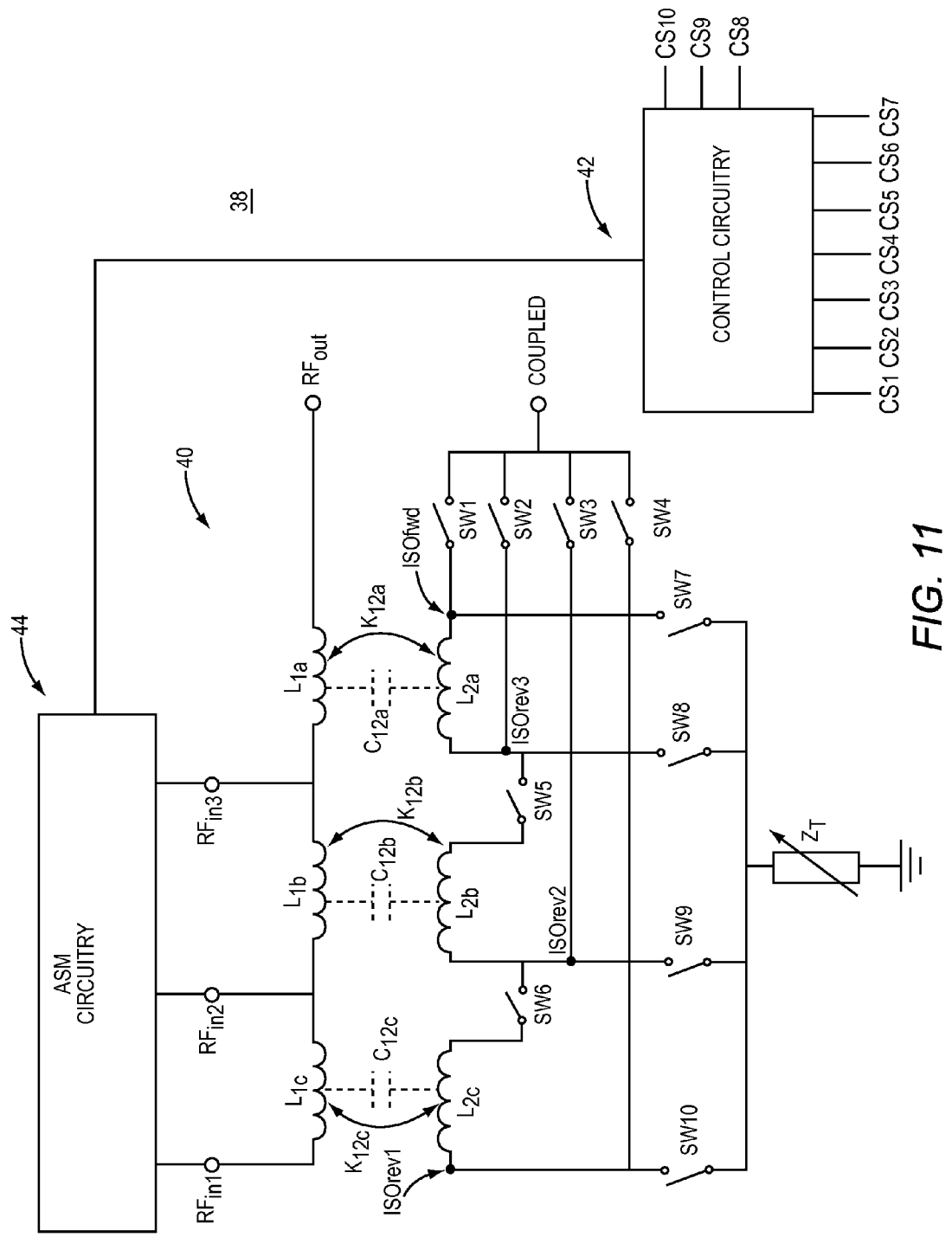
FIG. 11 shows an exemplary coupler system with multiple RF input ports and switchable secondary inductive segments.

Switchable RF Input Ports to a Primary Inductive Segment Combined with Switchable Secondary Inductive Segments In some applications in which the coupler is integrated with RF switches, such as in an antenna switch module (ASM), reconfiguration in primary inductive segments can be achieved. In addition to being able to vary the coupling factor by selectively switching secondary inductive segments, there is the flexibility to optimize the RF signal input port into the coupler's primary inductive segment depending on a desired transmit band of operation. An exemplary implementation of this embodiment is shown in FIG. 11. A coupler system 38 includes a reconfigurable directional coupler 40, control circuitry 42, and ASM circuitry 44. For illustration purposes, the reconfigurable directional coupler 40 is shown as having three separate coupler sections: a first primary inductive segment $L_{1a}$ and a first secondary inductive segment $L_{2a}$; a second primary inductive segment $L_{1b}$ and a second secondary inductive segment $L_{2b}$; and a third primary inductive segment $L_{1c}$ and a third secondary inductive segment $L_{2c}$. A first coupling capacitance $C_{12a}$ is formed between the first primary inductive segment $L_{1a}$ and the first secondary inductive segment $L_{2a}$; a second coupling capacitance $C_{12b}$ is formed between the second primary inductive segment $L_{1b}$ and the second secondary inductive segment $L_{2b}$; and a third coupling capacitance $C_{12c}$ is formed between the third primary inductive segment $L_{1c}$ and the third secondary inductive segment $L_{2c}$. The first primary inductive segment $L_{1a}$ is mutually coupled with the first secondary segment $L_{2a}$, the second primary inductive segment $L_{1b}$ is mutually coupled with the second secondary segment $L_{2b}$, and the third primary inductive segment $L_{1c}$ is mutually coupled with the third secondary segment $L_{2c}$. A first mutual coupling $K_{12a}$, a second mutual coupling $K_{12b}$ and a third mutual coupling $K_{12c}$ are expected to be in the 0.7-0.9 range, which keeps the inductive segments values low, resulting in a small low loss structure. In an actual application, the primary inductive segments may be all parts of a single merged structure. In addition, there are a first RF input port $RF_{in1}$, a second RF input port $RF_{in2}$ and a third RF input port $RF_{in3}$ used to inject an RF signal into the primary inductive segments, $L_{1a}$, $L_{1b}$, and $L_{1c}$. The third RF input port $RF_{in3}$ is located between an end of the first primary inductive segment $L_{1a}$ and a first end of the second primary inductive segment $L_{1b}$; the second RF input port $RF_{in2}$ is located between a second end of the second primary inductive segment $L_{1b}$ and a first end of the third primary inductive segment $L_{1c}$; and the first RF input port $RF_{in1}$ is located at a second end of the third primary inductive segment $L_{1c}$. SW1-SW6 switches are configured to selectively switch the first, the second and the third secondary inductive segments, $L_{2a}$, $L_{2b}$ and $L_{2c}$, into the secondary signal path. SW7-SW10 switches are configured to select forward or reverse power detection modes.

The illustration of the coupler 40 in FIG. 11 shows three coupler sections. The number of RF input ports obviously can be increased or decreased and the number of secondary inductive segments can be increased or decreased to better optimize performance for a given application. In this embodiment, when the coupler 40 operates in a low-frequency transmit band (i.e. band 12 with 699 MHz), the control circuitry 42 controls the switch circuitry to switch the first, the second and the third secondary inductive segments, $L_{2a}$, $L_{2b}$ and $L_{2c}$, into the secondary signal path and controls the ASM circuitry to inject an RF signal at the first RF input port $RF_{in1}$. The total coupling capacitance is formed by the sum of the first, the second and the third coupling capacitances, $C_{12a}$, $C_{12b}$ and $C_{12c}$. When the coupler 40 operates in a mid-frequency transmit band (i.e. band 33 with 1.92 GHz), the control circuitry 42 controls the switch circuitry to switch the first and the second secondary inductive segments, $L_{2a}$ and $L_{2b}$, into the secondary signal path and switch the third secondary inductive segment $L_{2c}$ out of the secondary signal path, and controls the ASM circuitry to inject the RF signal at the second RF input port $RF_{in2}$. The total coupling capacitance substantially reduces to the sum of the first and the second coupling capacitances, $C_{12a}$ and $C_{12b}$. Similarly, when the coupler operates in a high frequency transmit band (i.e. band 43 with 3.8 GHz), the control circuitry 42 controls the switch circuitry to switch the first secondary inductive segment $L_{2a}$ into the secondary signal path and switch the second and the third secondary inductive segments, $L_{2b}$ and $L_{2c}$, out of the secondary signal path, and controls the ASM circuitry to inject the RF signal at the third RF input port $RF_{in3}$. The total coupling capacitance substantially reduces to the first coupling capacitance $C_{12a}$. As such, the coupling factor decrease due to the frequency increase can be compensated by reducing the total coupling capacitance, and the reconfigurable directional coupler 40 could always be in a desired range. In addition, by adjusting the RF input port, the implementation losses of the coupler could be optimized since the RF signal no longer passes through the inactive primary inductive segment. Generally speaking, the high coupling capacitance modes are used in low frequency transmit band, the mid coupling capacitance modes are used in mid frequency transmit band and the low coupling capacitance modes are used in high frequency transmit band.

Table 5 lists the detailed switch settings with switchable RF input ports for the various high/low coupling capacitance and forward/reverse power detection modes.

TABLE 5

Switch Settings vs. Coupler Modes with Switchable RF Input Ports

| Coupler Mode | SW1 | SW2 | SW3 | SW4 | SW5 | SW6 | SW7 | SW8 | SW9 | SW10 |
|---|---|---|---|---|---|---|---|---|---|---|
| High capacitance forward power detection with RFin3 input port | open | open | open | closed | closed | closed | closed | open | open | open |
| High capacitance reverse power detection with RFin3 input port | closed | open | open | open | closed | closed | open | open | open | closed |
| Mid capacitance forward power detection with RFin2 input port t | open | open | closed | open | closed | open | closed | open | open | open |
| Mid capacitance reverse power detection with RFin2 input port | closed | open | open | open | closed | open | open | open | closed | open |
| Low capacitance forward power detection with RFin1 input port | open | closed | open | open | open | open | closed | open | open | open |
| Low capacitance reverse power detection with RFin1 input port | closed | open | open | open | open | open | open | closed | open | open |

Those skilled in the art will recognize improvements and modifications to the embodiments of the present disclosure. All such improvements and modifications are considered within the scope of the concepts disclosed herein and the claims that follow.

What is claimed is:

1. A coupler comprising:
   a primary inductive segment;
   a first secondary inductive segment wherein a portion of the first secondary inductive segment resides over a first portion of the primary inductive segment, wherein a first coupling capacitance is formed between the portion of the first secondary inductive segment and the first portion of the primary inductive segment;
   a second secondary inductive segment wherein a portion of the second secondary inductive segment resides over a second portion of the primary inductive segment, wherein a second coupling capacitance is formed between the portion of the second secondary inductive segment and the second portion of the primary inductive segment;
   a main signal path that extends between a first RF input port and an RF output port and includes the primary inductive segment;
   a secondary signal path that extends between a coupled port and ground; and
   switch circuitry configured to selectively switch the first and the second secondary inductive segments into the secondary signal path, wherein the first and the second coupling capacitance are included in a total coupling capacitance when the first and the second secondary inductive segments are included in the secondary signal path and the second coupling capacitance is substantially removed from the total coupling capacitance when the first secondary inductive segment is included in the secondary signal path and the second secondary inductive segment is excluded from the secondary signal path.

2. The coupler of claim 1 wherein the primary inductive segment is mutually coupled with the first and the second secondary segments.

3. The coupler of claim 1 further comprising a third secondary inductive segment wherein a portion of the third secondary inductive segment resides over a third portion of the primary inductive segment, wherein a third coupling capacitance is formed between the portion of the third secondary inductive segment and the third portion of the primary inductive segment, wherein the primary inductive segment is mutually coupled with the first, the second, and the third secondary segments.

4. The coupler of claim 3 wherein the switch circuitry is further configured to selectively switch the third secondary inductive segment into the secondary signal path, wherein the first, the second and the third coupling capacitances are included in the total coupling capacitance when the first, the second and the third secondary inductive segments are included in the secondary signal path, the first and the second coupling capacitances are included in the total coupling capacitance when the first and the second secondary inductive segments are included in the secondary signal path and the third secondary inductive segment is excluded from the secondary signal path, and the second and third coupling capacitances are substantially removed from the total coupling capacitance when the first second secondary inductive segment is included in the secondary signal path and the second and the third secondary inductive segments are excluded from the secondary signal path.

5. The coupler of claim 1 wherein the switch circuitry comprises a first switch between the first secondary inductive segment and the coupled port and a second switch between the second secondary inductive segment and the coupled port.

6. The coupler of claim 1 wherein the switch circuitry comprises a first switch between the first secondary inductive segment and the second secondary inductive segment.

7. The coupler of claim 6 wherein the switch circuitry comprises a shunt switch between the ground and a connection node of the first switch and the second secondary inductive segment.

8. The coupler of claim 1 further comprising at least one tunable impedance termination located between the switch circuitry and the ground.

9. The coupler of claim 8 wherein the switch circuitry includes a first switch between the at least one tunable impedance termination and the first secondary inductive segment and a second switch between the at least one tunable impedance termination and the second secondary inductive segment.

10. The coupler of claim 1 wherein the switch circuitry is further configured to switch the coupler between forward power detection modes and reverse power detection modes.

11. The coupler of claim 10 further comprising a first tunable impedance termination between the switch circuitry and the ground for the forward power detection modes and a second tunable impedance termination between the switch circuitry and the ground for the reverse power detection modes.

12. The coupler of claim 1 wherein the primary inductive segment comprises a first primary inductive segment and a second primary inductive segment, and further comprises a second RF input port located between the first primary inductive segment and the second primary inductive segment.

13. The coupler of claim 2 wherein the primary inductive segment comprises a first primary inductive segment, a second primary inductive segment and a third primary inductive segment, and further comprises a second RF input port located between the first primary inductive segment and the second primary inductive segment and a third RF input port located between the second primary inductive segment and the third primary inductive segment.

14. The coupler of claim 1 is a broadside coupled lines coupler.

15. The coupler of claim 14 wherein the primary inductive segment is a substantially U-shaped trace.

16. The coupler of claim 14 wherein the primary inductive segment is in a first plane and the first and the second secondary inductive segments are in a second plane.

17. The coupler of claim 16 wherein the first and the second secondary inductive segments are adjacent to one another.

18. The coupler of claim 1 wherein at least a portion of the first secondary inductive segment and a portion of the second secondary inductive segment do not reside over the primary inductive segment.

19. The coupler of claim 1 wherein essentially both of the first and the second secondary inductive segments reside over the primary inductive segment.

20. The coupler of claim 1 is an edge coupled lines coupler.

21. The coupler of claim 1 further comprising extrinsic capacitors coupled between the main signal path and the secondary signal path.

22. A coupler comprising:
a first coupler section comprising a first primary inductive segment mutually coupled with a first secondary inductive segment, wherein a portion of the first secondary inductive segment resides over the first primary inductive segment and a first coupling capacitance is formed between the portion of the first secondary inductive segment and the first primary inductive segment;
a second coupler section comprising a second primary inductive segment mutually coupled with a second secondary inductive segment, wherein a portion of the second secondary inductive segment resides over the second primary inductive segment and a second coupling capacitance is formed between the portion of the second secondary inductive segment and the second primary inductive segment, wherein the first secondary inductive segment does not overlap the second primary inductive segment and the second secondary inductive segment does not overlap the first primary inductive segment;
a main signal path that extends between an RF input port and an RF output port and includes the first primary inductive segment and the second primary inductive segment;
a secondary signal path that extends between a coupled port and ground; and
switch circuitry configured to selectively switch the first and the second secondary inductive segments into the secondary signal path, wherein the first and the second coupling capacitances are included in a total coupling capacitance when the first and the second secondary inductive segments are included in the secondary signal path and the second coupling capacitance is substantially removed from the total coupling capacitance when the first secondary inductive segment is included in the secondary signal path and the second secondary inductive segment is excluded from the secondary signal path.

23. A system comprising:
control circuitry; and
a coupler comprising:
a primary inductive segment;
a first secondary inductive segment wherein a portion of the first secondary inductive segment resides over a first portion of the primary inductive segment, wherein a first coupling capacitance is formed between the portion of the first secondary inductive segment and the first portion of the primary inductive segment;
a second secondary inductive segment wherein a portion of the second secondary inductive segment resides over a second portion of the primary inductive segment, wherein a second coupling capacitance is formed between the portion of the second secondary inductive segment and the second portion of the primary inductive segment;
a main signal path that extends between an RF input port and an RF output port and includes the primary inductive segment;
a secondary signal path that extends between a coupled port and ground; and
switch circuitry controlled by the control circuitry to selectively switch the first and the second secondary inductive segments into the secondary signal path based on an operating transmit band of the system, wherein the first and the second coupling capacitances are included in a total coupling capacitance by switching the first and the second secondary inductive segments into the secondary signal path when the system operates in a low frequency transmit band, and the second coupling capacitance is substantially removed from the total coupling capacitance by switching the first secondary inductive segment into the secondary signal path and switching the second secondary inductive segment out of the secondary signal path when the system operates in a high frequency transmit band.

24. The system of claim 23 wherein the primary inductive segment is mutually coupled with the first and the second secondary segments.

25. The system of claim 23 wherein the switch circuitry is further configured to switch the coupler between forward power detection modes and reverse power detection modes.

26. The system of claim 25 further comprising at least one tunable impedance termination located between the switch circuitry and the ground, wherein the at least one tunable impedance termination is tuned in value based on the forward and the reverse power detection modes of the coupler.

27. The system of claim 23 further comprising at least one tunable impedance termination located between the switch circuitry and the ground, wherein the at least one tunable impedance termination is tuned based on the total coupling capacitance of the coupler.

28. The system of claim 23 further comprising a third secondary inductive segment wherein a portion of the third secondary inductive segment resides over a first portion of the primary inductive segment, wherein a third coupling capacitance is formed between the portion of the third secondary inductive segment and the third portion of the primary inductive segment, wherein the primary inductive segment is mutually coupled with the first, the second, and the third secondary segments.

29. The system of claim 28 wherein the control circuitry further controls the switch circuitry to selectively switch the third secondary inductive segment into the secondary signal path, wherein the first, the second and the third coupling capacitances are included in the total coupling capacitance by switching the first, the second and the third secondary inductive segments into the secondary signal path when the system operates in a low frequency transmit band, the first and the second coupling capacitances are included in the total coupling capacitance by switching the first and the second secondary inductive segments into the secondary signal path and switching the third secondary inductive segment out of the secondary signal path when the system operates in a mid-frequency transmit band, and the second and the third coupling capacitances are substantially removed from the total coupling capacitance by switching the first secondary inductive segment into the secondary signal path and switching the second and the third secondary inductive segments out of the secondary signal path when the system operates in a high frequency transmit band.

* * * * *